US011751460B2

(12) United States Patent
Chen et al.

(10) Patent No.: US 11,751,460 B2
(45) Date of Patent: Sep. 5, 2023

(54) DISPLAY PANEL, METHOD OF MANUFACTURING THE SAME AND DISPLAY DEVICE

(71) Applicant: BOE Technology Group Co., Ltd., Beijing (CN)

(72) Inventors: Yipeng Chen, Beijing (CN); Lujiang Huangfu, Beijing (CN); Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/762,962

(22) PCT Filed: Apr. 15, 2021

(86) PCT No.: PCT/CN2021/087367
§ 371 (c)(1),
(2) Date: Mar. 23, 2022

(87) PCT Pub. No.: WO2021/227759
PCT Pub. Date: Nov. 18, 2021

(65) Prior Publication Data
US 2022/0336542 A1    Oct. 20, 2022

(30) Foreign Application Priority Data

May 9, 2020   (CN) .......................... 202010388571.2

(51) Int. Cl.
*H10K 59/131*   (2023.01)
*H10K 59/35*    (2023.01)
(Continued)

(52) U.S. Cl.
CPC ......... *H10K 59/353* (2023.02); *G09G 3/3233* (2013.01); *H10K 59/126* (2023.02);
(Continued)

(58) Field of Classification Search
CPC .. H10K 59/131; H10K 59/353; H10K 59/126; H10K 59/352; G09G 3/3233
See application file for complete search history.

(56) References Cited

U.S. PATENT DOCUMENTS 10,978,538 B2   4/2021  Wang et al.
2009/0009070 A1  1/2009  Chan et al.
(Continued)

FOREIGN PATENT DOCUMENTS

| CN | 106448555 A | 2/2017 |
| CN | 110085651 A | 8/2019 |

(Continued)

OTHER PUBLICATIONS

PCT/CN2021/087367 international search report and written opinion.
U.S. Appl. No. 17/948,576 office action dated Jul. 11, 2023.

*Primary Examiner* — Kevin M Nguyen
(74) *Attorney, Agent, or Firm* — IPRO, PLLC

(57) ABSTRACT

A display panel, a method of manufacturing the same, and a display device are provided. In the display panel, sub-pixel areas in a same row along a first direction are divided into a plurality of sub-pixel area groups independent from each other, and each sub-pixel area group includes at least two adjacent sub-pixel areas, a connection layer includes a connection pattern arranged in each sub-pixel area, and the connection pattern is coupled to the initialization signal line pattern in the sub-pixel area wherein the connection pattern is located, connection patterns located in a same sub-pixel area group are sequentially coupled along the first direction to form the connection portion; at least part of a first auxiliary signal line layer is located in an anode spacing area, and is insulated from an anode pattern, the connection pattern in each sub-pixel area group is coupled to the first auxiliary signal line layer.

15 Claims, 7 Drawing Sheets

(51) Int. Cl.
*G09G 3/3233* (2016.01)
*H10K 59/126* (2023.01)
*H10K 59/12* (2023.01)

(52) U.S. Cl.
CPC ......... *H10K 59/131* (2023.02); *H10K 59/352* (2023.02); *G09G 2300/0452* (2013.01); *G09G 2300/0842* (2013.01); *H10K 59/1201* (2023.02)

(56) References Cited

U.S. PATENT DOCUMENTS

| | | |
|---|---|---|
| 2010/0182303 A1 | 7/2010 | Takasugi et al. |
| 2013/0321492 A1 | 12/2013 | Tanaka |
| 2016/0035810 A1 | 2/2016 | Park |
| 2016/0043159 A1* | 2/2016 | Kim .................. H10K 59/131 257/71 |
| 2017/0221418 A1 | 8/2017 | Xiang et al. |
| 2017/0330928 A1* | 11/2017 | Choi .................... H10K 59/131 |
| 2019/0103454 A1 | 4/2019 | So et al. |
| 2019/0363151 A1 | 11/2019 | Kim et al. |
| 2020/0083309 A1 | 3/2020 | Wang et al. |

FOREIGN PATENT DOCUMENTS

| | | |
|---|---|---|
| CN | 110867525 A | 3/2020 |
| CN | 210349260 U | 4/2020 |
| CN | 111463255 A | 7/2020 |
| CN | 111508978 A | 8/2020 |

* cited by examiner

DISPLAY PANEL, METHOD OF MANUFACTURING THE SAME AND DISPLAY DEVICE

CROSS-REFERENCE TO RELATED APPLICATION

This application is the U.S. national phase of PCT Application No. PCT/CN2021/087367 filed on Apr. 15, 2021, which claims priorities of the Chinese patent application No. 202010388571.2 filed on May 9, 2020, which is incorporated herein by reference in its entity.

TECHNICAL FIELD

The present disclosure relates to the field of display technology, and more particularly to a display panel, a method of manufacturing the same and a display device.

BACKGROUND

Active-matrix organic light-emitting diode (AMOLED) display panels are widely used in various fields due to their advantages of self-luminescence, low power consumption, and fast response speed. The AMOLED display panel includes a sub-pixel driving circuit and a light-emitting unit, and the corresponding light-emitting unit is driven to emit light by the sub-pixel driving circuit, so as to realize the display function of the display panel.

However, as the resolution of the display panel becomes higher and higher, the layout space in the display panel becomes smaller and smaller. When the initialization signal line pattern used to provide the initialization signal for the sub-pixel driving circuit is laid out, the initialization signal line patterns in the same row are not easily connected together, resulting in increased production cost of the display panel.

SUMMARY

The objective of the present disclosure is to provide a display panel, a method of manufacturing the same, and a display device.

In order to achieve the above object, the present disclosure provides the following technical solutions:

A first aspect of the present disclosure provides a display panel, including: a substrate, and an initialization signal line layer, a connection layer and an anode layer that are sequentially stacked on the substrate along a direction away from the substrate; and a plurality of sub-pixel areas arranged in an array, wherein sub-pixel areas in a same row along a first direction are divided into a plurality of sub-pixel area groups independent from each other, and each of the plurality of sub-pixel area groups includes at least two adjacent sub-pixel areas; the initialization signal line layer includes an initialization signal line pattern arranged in each of the plurality of sub-pixel areas; the connection layer includes a connection pattern arranged in each of the plurality of sub-pixel areas, at least part of the connection pattern extends along the first direction, and the connection pattern is coupled to the initialization signal line pattern in a sub-pixel area where the connection pattern is located; connection patterns located in a same sub-pixel area group are sequentially coupled along the first direction to form the connection portion; the anode layer includes a plurality of anode patterns corresponding to the plurality of sub-pixel areas in a one-to-one manner, the plurality of anode patterns are arranged at intervals, and an anode spacing area is formed between adjacent anode patterns; the display panel further includes: a first auxiliary signal line layer, the first auxiliary signal line layer is a grid structure, and at least part of the first auxiliary signal line layer is located in the anode spacing area, and is insulated from the anode pattern, the connection pattern in each of the plurality of sub-pixel area groups is coupled to the first auxiliary signal line layer.

Optionally, the display panel further includes: a conductive connection layer, wherein the conductive connection layer includes a first conductive connection portion located in each of the plurality of sub-pixel areas, and in a same sub-pixel area, a first overlapping area is formed between an orthographic projection of the first conductive connection portion on the substrate and an orthographic projection of the initialization signal line pattern on the substrate, and the first conductive connection portion is coupled to the initialization signal line pattern through a first via hole arranged in the first overlapping area, a third overlapping area is formed between the orthographic projection of the first conductive connection portion on the substrate and an orthographic projection of the connection pattern on the substrate, the first conductive connection portion is coupled to the connection pattern through a third via hole arranged in the third overlapping area; there is a target conductive connection portion in the first conductive connection portion coupled to each connection portion, and a second overlapping area is formed between an orthographic projection of the target conductive connection portion on the substrate and a orthographic projection of the first auxiliary signal line layer on the substrate, and the target conductive connection portion is coupled to the first auxiliary signal line layer through s second via hole arranged in the second overlapping area.

Optionally, each initialization signal line pattern includes a first sub-pattern and a second sub-pattern, and in adjacent sub-pixel areas in the same row along the first direction, a second sub-pattern in a previous sub-pixel area and a first sub-pattern in a current sub-pixel area form an integral structure; in each of the plurality of sub-pixel areas, the first overlapping area is formed between an orthographic projection of the second sub-pattern on the substrate and an orthographic projection of the first conductive connection portion on the substrate, and the first conductive connection portion is coupled to the second sub-pattern through the first via hole arranged in the first overlapping area.

Optionally, the display panel further includes: a power supply signal line layer, wherein the power supply signal line layer includes a power supply signal line pattern arranged in each of the plurality of sub-pixel areas, and at least part of the power supply signal line pattern extends along a second direction, the second direction intersects the first direction; a third auxiliary signal line layer located between the initialization signal line layer and the power supply signal line layer, wherein the third auxiliary signal line layer includes a third auxiliary signal line pattern located in each of the plurality of sub-pixel areas, at least part of the third auxiliary signal line pattern extends along the first direction; in a same sub-pixel area, a fourth overlapping area is formed between an orthographic projection of the third auxiliary signal line pattern on the substrate and an orthographic projection of the power signal line pattern on the substrate, and the third auxiliary signal line pattern is coupled to the power signal line pattern in the fourth overlapping area; third auxiliary signal line patterns in a same row of sub-pixel areas along the first direction are sequentially coupled.

Optionally, the display panel further includes: a light-emitting control signal line layer, wherein the light-emitting control signal line layer includes a light-emitting control signal line pattern located in each of the plurality of sub-pixel areas, and at least part of the light-emitting control signal line pattern extends along the first direction; a reset signal line layer, wherein the reset signal line layer includes a reset signal line pattern located in each of the plurality of sub-pixel areas, and the reset signal line pattern extends along the first direction; wherein in a same sub-pixel area, the orthographic projection of the third auxiliary signal line pattern on the substrate is located between an orthographic projection of the light-emitting control signal line pattern on the substrate and an orthographic projection of the reset signal line pattern on the substrate, the third auxiliary signal line pattern is formed in a wavy structure.

Optionally, the display panel further includes: a gate line layer, wherein the gate line layer includes a gate line pattern located in each of the plurality of sub-pixel areas, and at least part of the gate line pattern extends along the first direction; a data line layer, wherein the data line layer includes a data line pattern located in each of the plurality of sub-pixel areas, at least part of the data line pattern extends along the second direction, the first direction intersects the second direction, an orthographic projection of the data line pattern on the substrate overlaps an orthographic projection of the gate line pattern on the substrate; a conductive connection portion layer, wherein the conductive connection portion layer includes a third conductive connection portion and a fourth conductive connection portion located in each of the plurality of sub-pixel areas; sub-pixel driving circuits corresponding to the plurality of sub-pixel areas in a one-to-one manner, wherein each of the sub-pixel driving circuits includes: a driving transistor, a storage capacitor, a first transistor and a second transistor; a gate electrode of the driving transistor is multiplexed as a first electrode plate of the storage capacitor, and the gate electrode of the driving transistor is coupled to a second electrode of the second transistor through the fourth conductive connection portion in the corresponding sub-pixel area, and a second electrode plate of the storage capacitor is coupled to a second electrode of the first transistor through the third conductive connection portion in the corresponding sub-pixel area; a gate electrode of the first transistor and a gate electrode of the second transistor are respectively coupled to the gate line pattern in the corresponding sub-pixel area; an orthographic projection of the gate line pattern on the substrate does not overlap an orthographic projection of the third conductive connection portion on the substrate, and/or the orthographic projection of the gate line pattern on the substrate does not overlap an orthographic projection of the fourth conductive connection portion on the substrate.

Optionally, the conductive connection portion layer further includes a second conductive connection portion located in each of the plurality of sub-pixel areas, the second conductive connection portion overlaps an orthographic projection of the anode pattern corresponding to a sub-pixel area where the second conductive connection portion is located on the substrate, and the second conductive connection portion is coupled to the anode pattern at the overlapping area; each of the sub-pixel driving circuits further includes a fifth transistor, an eighth transistor and a ninth transistor; a gate electrode of the fifth transistor is coupled to a corresponding reset signal line pattern, a first electrode of the fifth transistor is coupled to a corresponding initialization signal line pattern, a second electrode of the fifth transistor is coupled to the third conductive connection portion through a fourth via hole; a gate electrode of the eighth transistor is coupled to the corresponding reset signal line pattern, a first electrode of the eighth transistor is coupled to the corresponding initialization signal line pattern, a second electrode of the eighth transistor is coupled to the second conductive connection portion through a fifth via hole; a gate electrode of the ninth transistor is coupled to a corresponding light-emitting control signal line pattern, and a first electrode of the ninth transistor is coupled to the fourth conductive connection portion through a sixth via hole, a second electrode of the ninth transistor is floating; the third auxiliary signal line pattern includes a first auxiliary portion, a second auxiliary portion and a third auxiliary portion that are coupled in sequence; in one sub-pixel area, an orthographic projection of the first auxiliary portion on the substrate is located between an orthographic projection of the fifth via hole on the substrate and an orthographic projection of the sixth via hole on the substrate, and an orthographic projection of the second auxiliary portion on the substrate is located between the orthographic projection of the fifth via hole on the substrate and an orthographic projection of the fourth via hole on the substrate; an orthographic projection of the third auxiliary portion on the substrate is located between the orthographic projection of the sixth via hole on the substrate and the orthographic projection of the fourth via hole on the substrate.

Optionally, the display panel further includes: a data line layer, wherein the data line layer includes a data line pattern located in each of the plurality of sub-pixel areas, and at least part of the data line pattern extends along the second direction;

wherein adjacent third auxiliary signal line patterns located in a same row of sub-pixel areas along the first direction form a shielding portion at the coupling area, the shielding portion extends along the second direction, and an orthographic projection of the shielding portion on the substrate overlaps an orthographic projection of the data line pattern on the substrate, and along a direction perpendicular to the second direction, a width of the shielding portion is larger than a width of the data line pattern.

Optionally, the display panel further includes: sub-pixel driving circuits corresponding to the plurality of sub-pixel areas in a one-to-one manner, each of sub-pixel driving circuits including a driving transistor; a data line layer, wherein the data line layer includes a data line pattern located in each of the plurality of sub-pixel areas, at least part of the data line pattern extends along a second direction, the first direction intersects the second direction intersect; a power supply signal line layer, wherein the power supply signal line layer includes a power supply signal line pattern located in each of the plurality of sub-pixel areas, and at least part of the power supply signal line pattern extends along the second direction; wherein in a same sub-pixel area, an orthographic projection of the power signal line pattern on the substrate is located between an orthographic projection of a gate electrode of the driving transistor on the substrate and an orthographic projection of the data line pattern on the substrate.

Optionally, the power signal line pattern includes a first power supply portion and a second power supply portion coupled to each other, and the first power supply portion extends along the second direction, the second power supply portion protrudes from the first power supply portion in a direction away from a data line pattern in the sub-pixel area where the second power supply portion is located; in a direction perpendicular to the second direction and parallel to the substrate, a width of the first power supply portion is greater than a width of the second power supply portion; an orthographic projection of a first electrode of the driving transistor on the substrate overlaps an orthographic projection of the first power supply portion in the corresponding sub-pixel area on the substrate, and the first electrode of the driving transistor and the first power supply portion are coupled at the overlapping area.

Optionally, the display panel further includes: a first shielding layer, wherein the first shielding layer includes a first shielding pattern located in each of the plurality of sub-pixel areas, and an orthographic projection of the first shielding pattern on the substrate overlaps the orthographic projection of the first power supply portion on the substrate, the first shielding pattern is coupled to the first power supply portion at the overlapping area; at least part of the first shielding pattern extends along the second direction, the orthographic projection of the first shielding pattern on the substrate overlaps the orthographic projection of the data line pattern on the substrate.

Optionally, the display panel further includes: a gate line layer, wherein the gate line layer includes a gate line pattern located in each of the sub-pixel areas, and at least part of the gate line pattern extends along the first direction; a reset signal line layer, wherein the reset signal line layer includes a reset signal line pattern located in each of the sub-pixel areas, and the gate line pattern in the current sub-pixel area and the reset signal line pattern located in an adjacent next sub-pixel area along the second direction form an integral structure.

Optionally, the display panel further includes: a power signal line pattern, a data line pattern, a reset signal line pattern, a light-emitting control signal line pattern and a gate line pattern located in each of the plurality of sub-pixel areas; and sub-pixel driving circuits corresponding to the plurality of sub-pixel areas in a one-to-one manner, wherein each of the sub-pixel driving circuits includes: a first transistor, a second transistor, a third transistor, a fourth transistor, a fifth transistor, a sixth transistor, a seventh transistor, an eighth transistor, a ninth transistor and a storage capacitor; a gate electrode of the first transistor is coupled to the gate line pattern, a first electrode of the first transistor is coupled to the data line pattern, and a second electrode of the first transistor is coupled to a second electrode plate of the storage capacitor, and a first electrode plate of the storage capacitor is coupled to a gate electrode of the third transistor; a gate electrode of the second transistor is coupled to the gate line pattern, a first electrode of the second transistor is coupled to a second electrode of the third transistor, and a second electrode of the second transistor is coupled to the gate electrode of the third transistor; a first electrode of the third transistor is coupled to the power signal line pattern; a gate electrode of the fourth transistor is coupled to the reset signal line pattern, a first electrode of the fourth transistor is coupled to the initialization signal line pattern, and a second electrode of the fourth transistor is coupled to the gate electrode of the third transistor; a gate electrode of the fifth transistor is coupled to the reset signal line pattern, a first electrode of the fifth transistor is coupled to the initialization signal line pattern, and a second electrode of the fifth transistor is coupled to the second electrode plate of the storage capacitor; a gate electrode of the sixth transistor is coupled to the light-emitting control signal line pattern, a first electrode of the sixth transistor is coupled to the initialization signal line pattern, and a second electrode of the sixth transistor is coupled to the second electrode plate of the storage capacitor; a gate electrode of the seventh transistor is coupled to the light-emitting control signal line pattern, a first electrode of the seventh transistor is coupled to the second electrode of the third transistor, and a second electrode of the seventh transistor is coupled to the corresponding anode pattern; a gate electrode of the eighth transistor is coupled to the reset signal line pattern, a first electrode of the eighth transistor is coupled to the initialization signal line pattern, and a second electrode of the eighth transistor is coupled to the corresponding anode pattern; a gate electrode of the ninth transistor is coupled to a corresponding light-emitting control signal line pattern, a first electrode of the ninth transistor is coupled to the gate electrode of the third transistor, and the second electrode of the ninth transistor is floating.

In a second aspect, a display device includes the display panel.

In a third aspect, a method of manufacturing a display panel, wherein the display panel includes a plurality of sub-pixel areas arranged in an array, sub-pixel areas in a same row along a first direction are divided into a plurality of sub-pixel area groups independent from each other, and each of the plurality of sub-pixel area group includes at least two adjacent sub-pixel areas; the method includes: forming an initialization signal line layer, a connection layer, an anode layer and a first auxiliary signal line layer on a substrate; the initialization signal line layer includes an initialization signal line pattern arranged in each of the plurality of sub-pixel areas; the connection layer includes a connection pattern arranged in each of the plurality of sub-pixel areas, at least part of the connection pattern extends along the first direction, and the connection pattern is coupled to the initialization signal line pattern in a sub-pixel area where the connection pattern is located; connection patterns located in a same sub-pixel area group are sequentially coupled along the first direction to form the connection portion; the anode layer includes a plurality of anode patterns corresponding to the plurality of sub-pixel areas in a one-to-one manner, the plurality of anode patterns are arranged at intervals, and an anode spacing area is formed between adjacent anode patterns; the first auxiliary signal line layer is a grid structure, and at least part of the first auxiliary signal line layer is located in the anode spacing area, and is insulated from the anode pattern, the connection pattern in each of the plurality of sub-pixel area groups is coupled to the first auxiliary signal line layer.

BRIEF DESCRIPTION OF THE DRAWINGS

The drawings described here are used to provide a further understanding of the present disclosure and constitute a part of the present disclosure. The exemplary embodiments and descriptions of the present disclosure are used to explain the present disclosure, and do not constitute an improper limitation of the present disclosure.

DETAILED DESCRIPTION

In order to further illustrate the display panel, the manufacturing method thereof, and the display device provided by the embodiments of the present disclosure, a detailed description is given below with reference to the accompanying drawings.

Figure 3:
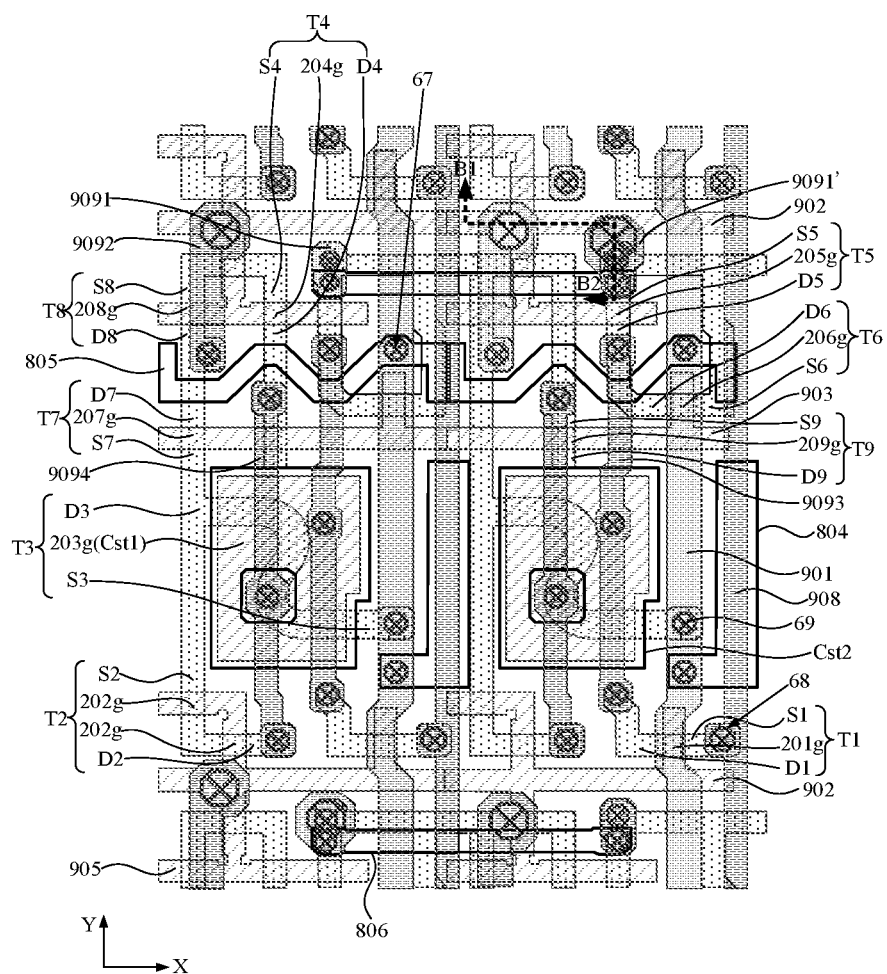
FIG. 3 is a schematic diagram of a layout of a sub-pixel driving circuit provided by an embodiment of the present disclosure.
Figure 6:
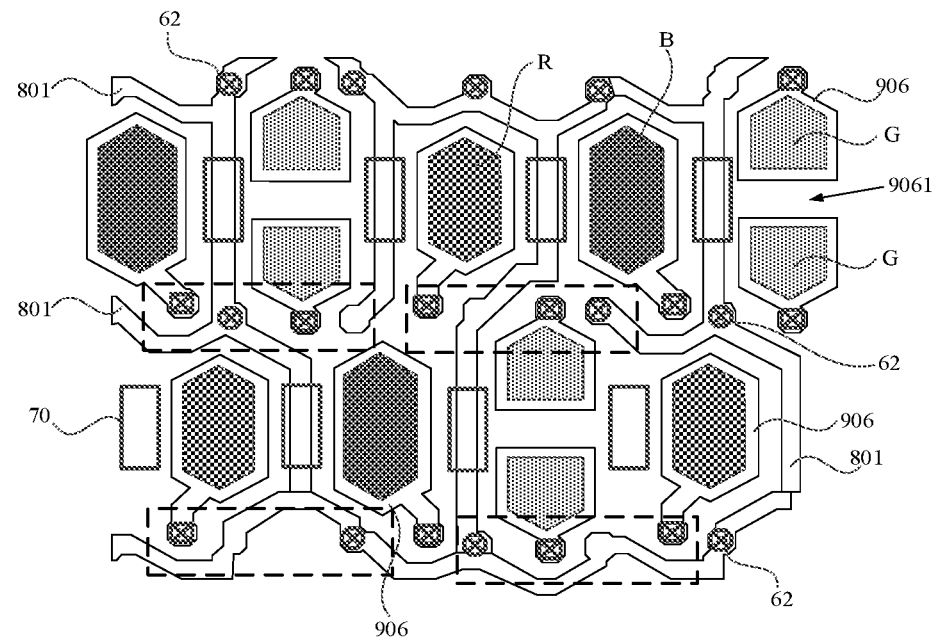
FIG. 6 is a schematic diagram of a second layout of a first auxiliary signal line layer according to an embodiment of the present disclosure.
Figure 7:
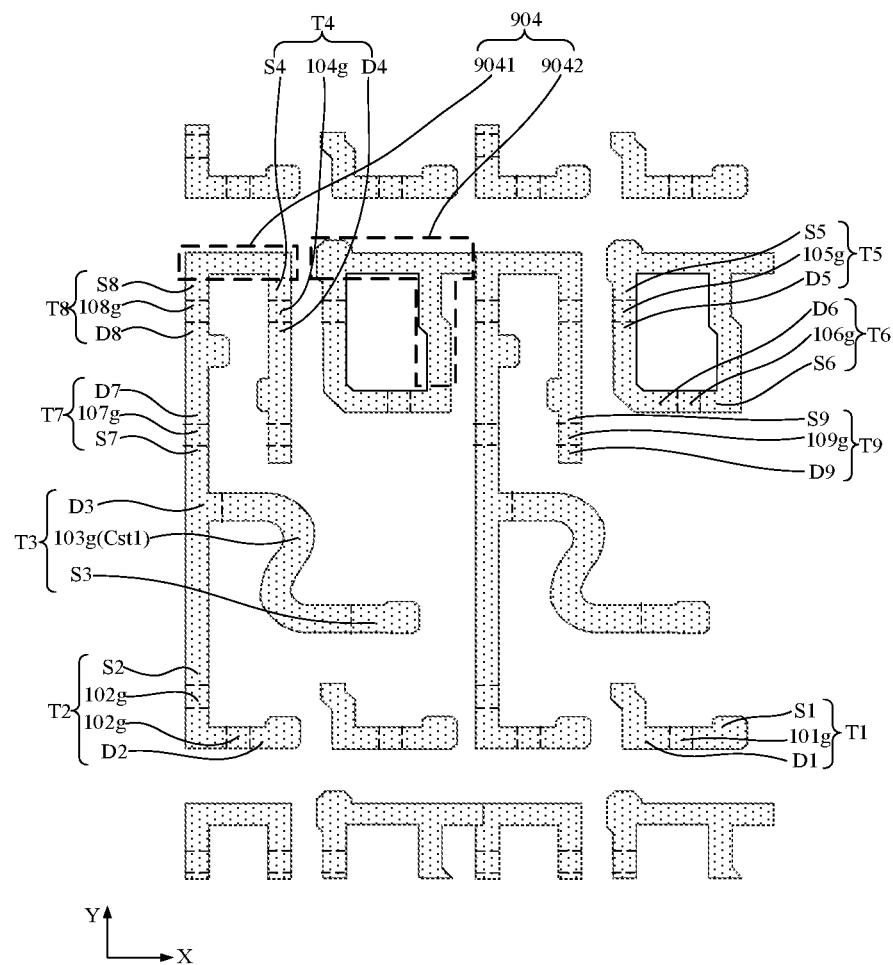
FIG. 7 is a schematic diagram of a layout of an active film layer in FIG. 3.
Figure 9:
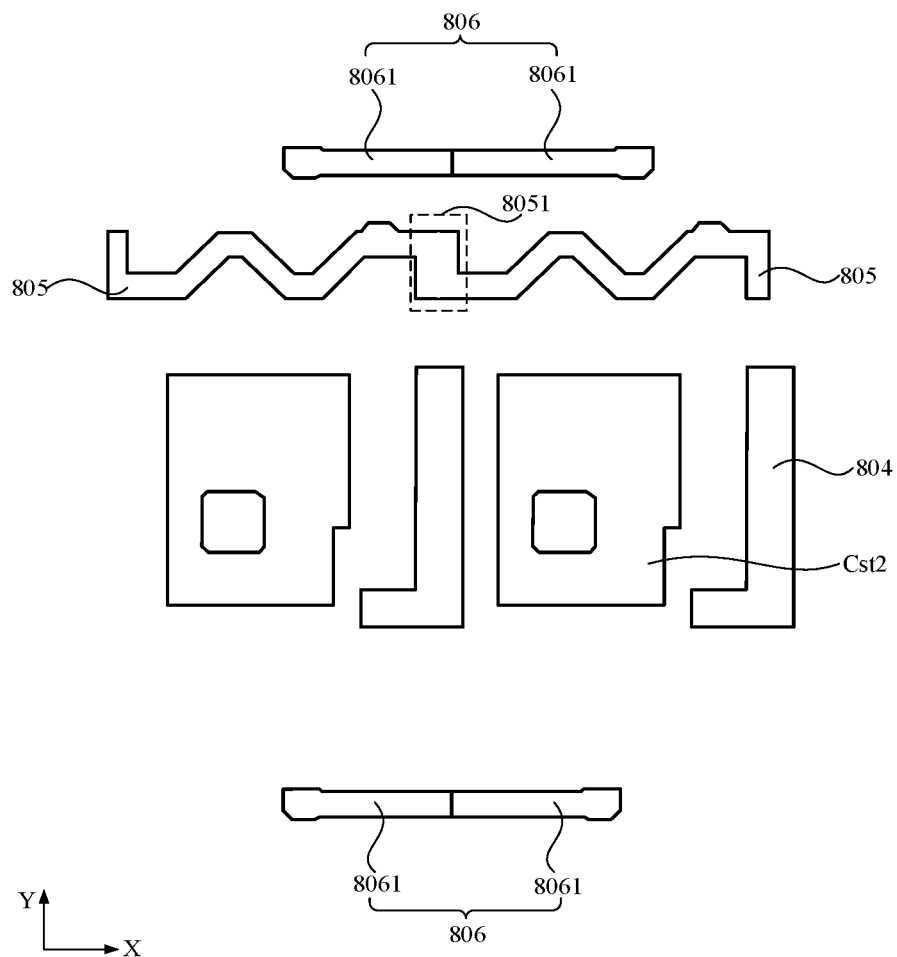
FIG. 9 is a schematic diagram of a layout of a second gate metal layer in FIG. 3.

Referring to FIGS. 3 to 6, an embodiment of the present disclosure provides a display panel, including: a substrate, and an initialization signal line layer, a connection layer and an anode layer that are sequentially stacked on the substrate along a direction away from the substrate; it also includes a plurality of sub-pixel areas arranged in an array, sub-pixel areas in the same row along the first direction are divided into a plurality of sub-pixel area groups independent from each other, and each sub-pixel area group includes adjacent at least two sub-pixel areas;

As shown in FIG. 3 and FIG. 7, the initialization signal line layer includes an initialization signal line pattern 904 arranged in each of the sub-pixel areas;

As shown in FIG. 3 and FIG. 9, the connection layer includes a connection pattern 8061 arranged in each of the sub-pixel areas. At least part of the connection pattern 8061 extends along the first direction, and the connection pattern 8061 is coupled to the initialization signal line pattern 904 in the sub-pixel area where the connection pattern 8061 is located; the connection patterns 8061 located in the same sub-pixel area group are sequentially coupled along the first direction to form the connection portion 806;

As shown in FIG. 6, the anode layer includes a plurality of anode patterns 906 corresponding to the plurality of sub-pixel areas in a one-to-one manner, the plurality of anode patterns 906 are arranged at intervals, and an anode spacing area 9061 is formed between adjacent anode patterns 906;

The display panel further includes: a first auxiliary signal line layer 801, the first auxiliary signal line layer 801 is a grid structure, and at least part of the first auxiliary signal line layer 801 is located in the anode spacing area 9061, and is insulated from the anode pattern 906, the connection pattern 806 in each of the sub-pixel area groups is coupled to the first auxiliary signal line layer 801.

Specifically, the plurality of sub-pixel areas arranged in the array can be divided into multiple rows of sub-pixel areas sequentially arranged along the second direction, and multiple columns of sub-pixel areas sequentially arranged along the first direction. Each row of sub-pixel areas includes a plurality of sub-pixel areas arranged at intervals along the first direction, and each column of sub-pixel areas includes a plurality of sub-pixel areas arranged at intervals along the second direction. The first direction intersects the second direction. Exemplarily, the first direction includes the X direction, and the second direction includes the Y direction.

In the plurality of sub-pixel areas, the sub-pixel areas located in the same row along the first direction can be divided into a plurality of sub-pixel area groups independent from each other, and each sub-pixel area group includes at least two adjacent sub-pixel areas; it is worth noting that, each sub-pixel area may only belong to one sub-pixel area group.

The initialization signal line layer includes a plurality of initialization signal line patterns 904, the plurality of initialization signal line patterns 904 correspond to the plurality of sub-pixel areas in a one-to-one manner, and the initialization signal line pattern 904 is located in the corresponding sub-pixel area, is used to provide an initialization signal for the sub-pixel driving circuit corresponding to the sub-pixel area.

The connection layer includes a plurality of connection patterns 8061 corresponding to the plurality of sub-pixel areas in a one-to-one manner, the connection pattern 8061 are located in the corresponding sub-pixel area, and in the same sub-pixel area, the connection patterns 8061 can be coupled to the initialization signal line pattern 904 in various ways; for example, the connection pattern 8061 is located on the side of the initialization signal line pattern 904 away from the substrate. A via hole is formed between the connection pattern 8061 and the initialization signal line pattern 904, so that the connection pattern 8061 is directly coupled to the initialization signal line pattern 904 through the via hole.

The specific structure of the connection pattern 8061 is various. Exemplarily, at least part of the connection pattern 8061 extends along the first direction, and connection patterns 8061 in the same sub-pixel group can be sequentially coupled along the first direction to form the connection portion 806; exemplarily, the connection patterns 8061 included in the connection portion 806 are formed as an integral structure. The connection pattern 8061 may be made by using the second gate metal layer in the display panel, but is not limited thereto.

The anode layer is located on the side of the connection portion 806 away from the substrate, and the anode layer includes a plurality of anode patterns 906, and the plurality of anode patterns 906 are spaced apart from each other, and an anode spacing area 9061 is formed between adjacent anode patterns 906. The anode patterns 906 correspond to the sub-pixel driving circuits in the display panel in a one-to-one manner. The anode patterns 906 are coupled to the corresponding sub-pixel driving circuits and can receive driving signals provided by the corresponding sub-pixel driving circuits. A light-emitting functional layer and a cathode layer are further arranged at a side of the anode layer away from the substrate, the light-emitting functional layer is located between the anode layer and the cathode layer, and can emit light of a correspond color under the action of the electrical field formed between the anode layer and the cathode layer. It should be noted that the light-emitting functional layer may specifically include a hole injection layer, a hole transport layer, an organic light-emitting material layer, an electron transport layer and an electron injection layer that are stacked on each other, but is not limited thereto. FIG. 6 shows a red light-emitting element R, a green light-emitting element G, and a blue light-emitting element B, and light-emitting elements of different colors correspond to organic light-emitting material layers of different colors.

As shown in FIG. 6, the display panel further includes a first auxiliary signal line layer 801, and at least part of the first auxiliary signal line layer 801 is arranged in the anode spacing area 9061 and insulated from the anode pattern 906.

The anode spacing area 9061 is formed as a grid area, so that the first auxiliary signal line layer 801 arranged in the anode spacing area 9061 is formed into a grid structure. Exemplarily, the first auxiliary signal line layer 801 may be arranged in all the anode spacing arears 9061 in the display panel.

Figure 4:
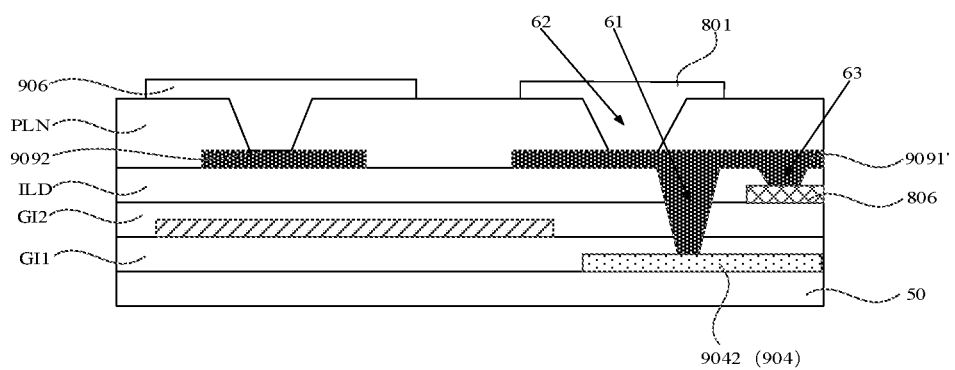
FIG. 4 is a schematic cross-sectional view along the B1-B2 direction in FIG. 3.

It is worth noting that, as shown in FIG. 4, the display panel also includes a planarization layer PLN, and the anode layer (including the anode pattern 906) is generally formed on the surface of the planarization layer PLN away from the substrate 50. The first auxiliary signal line layer 801 is arranged in the anode spacing area 9061, so that the first auxiliary signal line layer 801 is also arranged on the surface of the planarization layer PLN away from the substrate 50. An auxiliary signal line layer 801 and the anode layer are arranged at the same layer, so as to avoid increasing the thickness of the display panel due to the introduction of the first auxiliary signal line layer 801.

The first auxiliary signal line layer 801 is arranged in the anode spacing area 9061, so that the first auxiliary signal line layer 801 is located on the side of the connection portion 806 away from the substrate 50, exemplarily, a corresponding via hole structure can be provided between the first auxiliary signal line layer 801 and each of the connection portions 806, so that the first auxiliary signal line layer 801 can be coupled with each of the connection portions 806 through the corresponding via hole structure.

According to the specific structure of the above-mentioned display panel, in the display panel provided by the embodiment of the present disclosure, the sub-pixel areas in the same row along the first direction are divided into a plurality of sub-pixel area groups independent from each other, and each sub-pixel area group includes at least two adjacent sub-pixel areas, the connection portions 806 corresponding to the sub-pixel area groups in a one-to-one manner are disposed at the same time. The initialization signal patterns 904 in the sub-pixel areas in the corresponding sub-pixel area group are coupled together through the connection portion 806, and the connection portion 806 in each of the sub-pixel area groups is coupled to the first auxiliary signal line layer 801; this arrangement enables the first auxiliary signal line layer 801 to couple all the initialization signal line patterns 904 in each sub-pixel area together, so that the first auxiliary signal line layer 801 can provide an initialization signal for the initialization signal line pattern 904 in each sub-pixel area; therefore, in the display panel provided by the embodiment of the present disclosure, the initialization signal line pattern 904 in each sub-pixel area is respectively coupled to the first auxiliary signal line layer 801 arranged in the anode spacing area 9061, which solves the problem that the initialization signal line patterns 904 in the same row are not easily connected together due to the limited layout space of the display panel.

Moreover, in the display panel provided by the embodiment of the present disclosure, the first auxiliary signal line layer 801 may be arranged in all the anode spacing areas 9061 in the display area, and the initialization signal line pattern 904 in each sub-pixel area is coupled to the auxiliary signal line layer 801 to ensure the stability of the initialization signal transmitted on the initialization signal line pattern 904 in each sub-pixel area. In addition, by arranging the first auxiliary cathode layer in the anode spacing area 9061, the first auxiliary signal line layer 801 and the anode layer can be arranged at the same layer, which is more beneficial to the thinning of the display panel.

In addition, in the display panel provided by the embodiment of the present disclosure, each initialization pattern in the sub-pixel area group is coupled to the first auxiliary signal line pattern by dividing the sub-pixel area group and introducing the connection portion 806, so that only one via hole structure needs to be provided between each connection portion 806 and the first auxiliary signal line layer 801 to realize the coupling between the connection portion 806 and the first auxiliary signal line layer 801, so that the initialization signal line patterns 904 in the at least two sub-pixel areas coupled to the connection portion 806 is coupled to the first auxiliary signal line layer 801. Therefore, in the display panel provided by the embodiment of the present disclosure, each of the initialization signal line patterns 904 is coupled to the first auxiliary signal line pattern, and the number of via hole structures penetrating the planarization layer PLN is effectively reduced at the same time.

It should be noted that the initialization signal line pattern 904 provided in the above-mentioned embodiment is not only used to provide the initialization signal (Vinit) for the corresponding sub-pixel driving circuit, but also can be used to provide the reference signal (Vref) for the corresponding sub-pixel driving circuit.

In some embodiments, the initialization signal line pattern 904 and the active layer in the transistor structure in the display panel are arranged at the same layer and made of the same material.

Specifically, the initialization signal line pattern 904 and the active layer in the transistor structure being arranged at the same layer and made of the same material enables the initialization signal line pattern 904 and the active layer to be formed in the same patterning process. Moreover, since the first electrode (or the second electrode) of the transistor structure in the display panel coupled to the initialization signal line pattern 904 is also made of the active layer, the first electrode (or the second electrode) and the initialization signal line pattern 904 coupled thereto can be formed into an integral structure, thereby further saving the layout space occupied by the transistor structure and the initialization signal line pattern 904, improving the resolution of the display panel.

In some embodiments, the first auxiliary signal line layer 801 and the anode layer are arranged at the same layer and made of the same material.

Specifically, the first auxiliary signal line layer 801 and the anode layer are arranged at the same layer and made of the same material, so that the first auxiliary signal line layer 801 and the anode layer can be formed in the same patterning process, and an additional patterning process specially used for manufacturing the first auxiliary cathode layer is not necessary, thereby effectively simplifying the manufacturing process and saving the manufacturing cost.

It is worth noting that when the first auxiliary signal line layer 801 and the anode layer are arranged at the same layer and made of the same material, a certain distance needs to be reserved between the first auxiliary signal line layer 801 and the anode layer, so as to avoid the short circuit between the first auxiliary signal line layer 801 and the anode layer, and avoid affecting the yield of the display panel.

As shown in FIG. 3 and FIG. 4, in some embodiments, the display panel further includes:

A conductive connection layer, the conductive connection layer includes a first conductive connection portion 9091 located in each of the sub-pixel areas, and in the same sub-pixel area, a first overlapping area is formed between an orthographic projection of the first conductive connection portion 9091 on the substrate 50 and an orthographic projection of the initialization signal line pattern 904 on the substrate 50, and the first conductive connection portion 9091 is coupled to the initialization signal line pattern 904 through the first via hole arranged in the first overlapping area, a third overlapping area is formed between the orthographic projection of the first conductive connection portion 9091 on the substrate 50 and the orthographic projection of the connection pattern 8061 on the substrate 50, the first conductive connection portion 9091 is coupled to the connection pattern 8061 through a third via hole arranged in the third overlapping area;

In each of the first conductive connection portions 9091 coupled to each connection portion 806, there is a target conductive connection portion 9091', and a second overlapping area is formed between an orthographic projection of the target conductive connection portion 9091' on the substrate 50 and the orthographic projection of the first auxiliary signal line layer 801 on the substrate 50, and the target conductive connection portion 9091' is coupled to the first auxiliary signal line layer 801 through s second via hole arranged in the second overlapping area.

Specifically, the conductive connection portion layer is located between the connection layer and the first auxiliary signal line layer 801, and the conductive connection portion layer can be made by using the first source-drain metal layer in the display panel. The conductive connection portion layer includes a plurality of first conductive connection portions 9091 corresponding to the plurality of sub-pixel areas in a one-to-one manner, and the first conductive connection portion 9091 is located in the corresponding sub-pixel area.

As shown in FIG. 3 and FIG. 4, the specific structure of the first conductive connection portion 9091 included in the conductive connection portion layer can be set according to actual needs, as long as in the same sub-pixel area, the first overlapping area is formed between the orthographic projection of the first conductive connection portion 9091 (the target conductive connection portion 9091' in FIG. 4) on the substrate 50 and the orthographic projection of the initialization signal line pattern 904 on the substrate 50, and the third overlapping area is formed between the orthographic projection of the first conductive connection portion 9091 on the substrate 50 and the orthographic projection of the connection pattern 8061 on the substrate 50; thus, the first conductive connection portion 9091 can be coupled to the initialization signal line pattern 904 through the first via hole 61 arranged in the first overlapping area, and the first conductive connection portion 9091 can be coupled to the connection pattern 8061 (the connection portion 806 in FIG. 4) through the third via hole 63 arranged in the third overlapping area, so that the initialization signal line pattern 904 can be coupled to the connection pattern 8061 through the first conductive connection portion 9091.

In first conductive connection portions 9091 coupled to the connection patterns 8061 in each of the connection portions 806 are correspondingly coupled, there is a target conductive connection portion 9091', and a second overlapping area is formed between the orthographic projection of the target conductive connection portion 9091' on the substrate 50 and the orthographic projection of the first auxiliary signal line layer 801 on the substrate 50, and the target conductive connection portion 9091 is coupled to the first auxiliary signal line layer 801 through the second via hole 62 arranged in the second overlapping area.

It should be noted that FIG. 4 also shows a first gate insulating layer GI1, a second gate insulating layer GI2, an interlayer insulating layer ILD and a planarization layer PLN.

In the display panel provided by the above embodiment, the first conductive connection portion 9091 is located on the side of the initialization signal line pattern 904 away from the substrate 50, a first gate insulating layer GIL a second gate insulating layer GI2 and an interlayer insulating layer ILD are formed between the first conductive connection portion 9091 and the initialization signal line pattern 904. The first conductive connection portion 9091 is located on the side of the connection pattern 8061 away from the substrate 50, the interlayer insulating layer ILD is formed between the first conductive connection portion 9091 and the connection pattern 8061; in this way, after the interlayer insulating layer ILD is formed, a via etching process (via mask) can be used to form the first via hole 61 penetrating the first gate insulating layer GIL the second gate insulating layer GI2 and the interlayer insulating layer ILD, and a third via hole 63 penetrating the interlayer insulating layer ILD. After the first conductive connection portion 9091 is formed, the first conductive connection portion 9091 can be coupled to the initialization signal line pattern 904 through the first via hole 61, and can be coupled to the connection pattern 8061 through the third via hole 63, this method effectively reduces the number of via masks, simplifies the manufacturing process of the display panel, and saves the manufacturing cost.

In addition, in the display panel provided by the above-mentioned embodiment, the connection pattern 8061 is coupled to the first auxiliary signal line layer 801 by arranging the target conductive connection portion 9091' to be coupled with the first auxiliary signal line layer 801, so as to avoid forming a deep via hole between the connection pattern 8061 and the first auxiliary signal line layer 801, which greatly improves the reliability of the coupling between the connection pattern 8061 and the first auxiliary signal line layer 801. This arrangement makes the connection pattern 8061 and the first auxiliary signal line layer 801 have more layout methods, which reduces the layout difficulty and manufacturing difficulty of the display panel.

In more detail, taking each sub-pixel area group including two sub-pixel areas as an example, when the connection portion 806 is not provided in the display panel, the initialization signal line pattern 904 in each sub-pixel area is coupled to the conductive connection portion, the conductive connection portion is coupled to the first auxiliary signal line layer 801 through a PLN hole (i.e. the second via hole 62) penetrating the planarization layer PLN, so that each sub-pixel area includes one PLN hole for coupling the first auxiliary signal line layer 801. In the display panel provided by the above-mentioned embodiment, in each sub-pixel area group, two sub-pixel areas are coupled to the first auxiliary signal line layer 801 through the corresponding connection portion 806 and one PLN hole penetrating the planarization layer PLN, the number of PLN holes to be set in the display panel is reduced by half, which is more beneficial to increase the layout space of the anode layer and the first auxiliary signal line layer 801.

Figure 5:
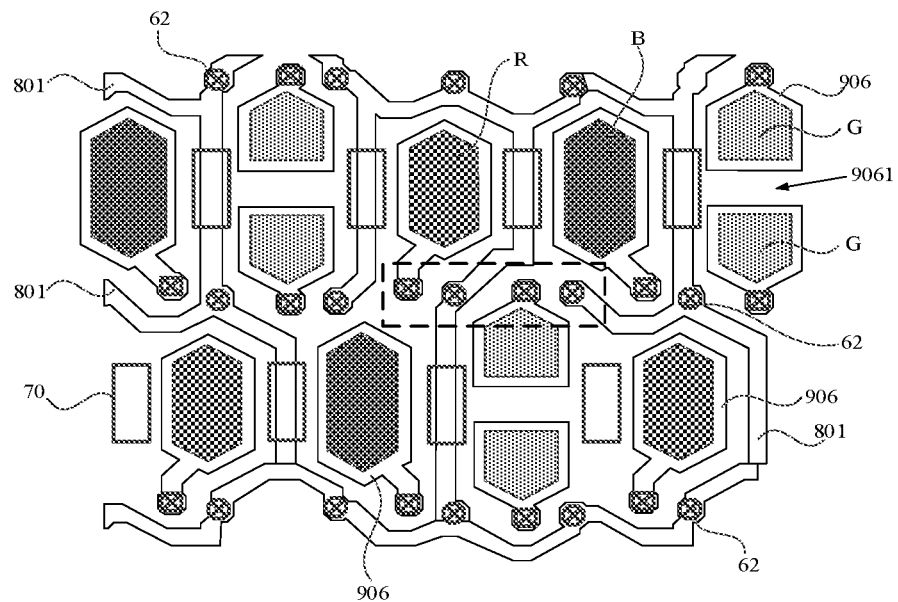
FIG. 5 is a schematic diagram of a first layout of a first auxiliary signal line layer according to an embodiment of the present disclosure.

In more detail, referring to FIGS. 5 and 6, the dashed box in FIG. 5 shows that two adjacent sub-pixel areas are provided with two second via holes 62, and each dashed box in FIG. 6 shows two adjacent sub-pixel areas are provided with only one second via hole 62.

As shown in FIG. 3, FIG. 4 and FIG. 7, in some embodiments, each of the initialization signal line patterns 904 includes a first sub-pattern 9041 and a second sub-pattern 9042, and in adjacent sub-pixel areas in the same row along the first direction, the second sub-pattern 9042 in the previous sub-pixel area and the first sub-pattern 9041 in the current sub-pixel area form an integral structure; in each sub-pixel area, the first overlapping area is formed between an orthographic projection of the second sub-pattern 9042 on the substrate 50 and the orthographic projection of the first conductive connection portion 9091 on the substrate 50, and the first conductive connection portion 9091 is coupled to the second sub-pattern 9042 through the first via hole 61 arranged in the first overlapping area.

Specifically, the specific structures of the initialization signal line patterns are various. Exemplarily, each of the initialization signal line patterns includes a first sub-pattern 9041 and a second sub-pattern 9042. In the same sub-pixel area, the first sub-pattern 9041 and the second sub-pattern 9042 are arranged along the first direction. When such structure is applied to the initialization signal line pattern, in adjacent sub-pixel areas, the second sub-pattern 9042 in the previous sub-pixel area and the first sub-pattern 9041 in the current sub-pixel area are adjacent.

In the adjacent sub-pixel areas in the same row along the first direction, and the second sub-pattern 9042 in the previous sub-pixel area and the first sub-pattern 9041 in the current sub-pixel area form an integral structure, which is not only conducive to improve the stability of the initialization signal transmitted on the initialization signal line pattern, and effectively reduce the manufacturing difficulty of the initialization signal line pattern.

It should be noted that when the initialization signal line pattern includes the first sub-pattern 9041 and the second sub-pattern 9042, exemplarily, the first sub-pattern 9041 and the second sub-pattern 9042 can be set to be respectively coupled to the first conductive connection portion. This connection method can better ensure the connection performance between the initialization signal line pattern and the first auxiliary signal line layer, and can more effectively improve the stability of the initialization signal transmitted on the initialization signal line pattern. Or, as shown in FIG. 4, in each sub-pixel area, the second sub-pattern 9042 is coupled to the first conductive connection portion 9091, that is, as shown in FIG. 4, the first conductive connection portion 9091 is coupled to the second sub-pattern 9042 through the first via hole 61 arranged in the first overlapping area, and the first conductive connection portion 9091 is coupled to the first auxiliary signal line layer 801 through the second via hole 62 arranged in the second overlapping area.

As shown in FIG. 5 and FIG. 9, in some embodiments, the display panel further includes:

A power supply signal line layer, the power supply signal line layer includes a power supply signal line pattern 901 arranged in each of the sub-pixel areas, and at least part of the power supply signal line pattern 901 extends along a second direction, the second direction intersects the first direction;

A third auxiliary signal line layer located between the initialization signal line layer and the power supply signal line layer, the third auxiliary signal line layer includes a third auxiliary signal line pattern 805 located in each of the sub-pixel areas, at least part of the third auxiliary signal line pattern 805 extends along the first direction; in the same sub-pixel area, a fourth overlapping area is formed between an orthographic projection of the third auxiliary signal line pattern 805 on the substrate and an orthographic projection of the power signal line pattern 901 on the substrate, and the third auxiliary signal line pattern 805 is coupled to the power signal line pattern 901 in the fourth overlapping area; the third auxiliary signal line patterns 805 in the same row of sub-pixel areas along the first direction are sequentially coupled.

Specifically, the power supply signal line layer is located between the initialization signal line layer and the anode layer, and the power supply signal line layer includes a power supply signal line pattern 901 arranged in each of the sub-pixel areas. The signal line patterns 901 correspond to the sub-pixel areas in a one-to-one manner, and the power signal line patterns 901 are located in the corresponding sub-pixel areas. At least a part of the power signal line pattern 901 extends along the second direction, and the power signal line patterns 901 located in each column of sub-pixel areas are sequentially coupled along the second direction, and form an integral structure.

The third auxiliary signal line patterns 805 correspond to the sub-pixel areas in a one-to-one manner, the third auxiliary signal line pattern 805 is located in the corresponding sub-pixel area, and at least part of the third auxiliary signal line pattern 805 extends along the first direction, the third auxiliary signal line patterns 805 located in the same row of sub-pixel areas along the first direction are sequentially coupled, exemplarily, the third auxiliary signal line patterns 805 located in the same row of sub-pixel areas along the first direction form an integral structure.

At least part of the power signal line pattern 901 extends along a second direction, and the second direction intersects with the first direction, so in the same sub-pixel area, the fourth overlapping area is formed between the orthographic projection of the third auxiliary signal line pattern 805 on the substrate and the orthographic projection of the power signal line pattern 901 on the substrate, and the third auxiliary signal line pattern 805 is coupled to the power signal line pattern 901 through a seventh via hole 67 arranged in the fourth overlapping area.

In the display panel provided by the above embodiment, the power signal line patterns 901 located in the same column of sub-pixel areas along the second direction are sequentially coupled, and the third auxiliary signal line patterns 805 located in the same row of sub-pixel areas along the first direction are sequentially coupled, and the third auxiliary signal line pattern 805 is coupled to the power supply signal line pattern 901 in the same sub-pixel, so that the power supply signal line layer and the third auxiliary signal line layer form a grid structure with crossing wiring. This arrangement effectively improves the stability of the power signal line layer, and the power signal transmitted on the power signal line layer is used to provide to the source electrode of an driving transistor in the sub-pixel driving circuit, while the light-emitting current generated by the sub-pixel driving circuit is $I_{oled}=k[(Vgs-Vth)]^2$, $Vgs=Vg-Vs$, Vg is the gate voltage of the driving transistor, Vs is the source voltage of the driving transistor, and Vth is the threshold voltage of the driving transistor, the power signal of Vs will have an impact on the value of the light-emitting current $I_{oled}$. Therefore, the above setting method can improve the stability of the power signal line layer, and at the same time, ensure the stability of the light-emitting current $I_{oled}$, and effectively avoid dynamic crosstalk phenomenon.

As shown in FIG. 3 and FIG. 9, in some embodiments, the display panel further includes a transistor structure and a storage capacitor Cst, and the storage capacitor Cst includes a first electrode plate Cst1 and a second electrode plate Cst2 disposed opposite to each other, so the first electrode plate Cst1 is located between the substrate and the second electrode plate Cst2, and the first electrode plate Cst1 and the gate electrode of the transistor structure are arranged at the same layer and made of the same material; the third auxiliary signal line layer and the second electrode plate Cst2 are arranged at the same layer and made of the same material.

Specifically, the layout of film layers corresponding to the sub-pixel driving circuit is as follows: an active film layer, a first gate insulating layer, a first gate metal layer, a second gate insulating layer, a second gate metal layer, an interlayer insulating layer, a first source-drain metal layer and a planarization layer that are stacked in sequence along the direction away from the substrate.

The sub-pixel driving circuit includes a storage capacitor Cst and a plurality of transistor structures, the active film layer is used to form an active pattern in the plurality of transistor structures, and the first gate metal layer is used to form the gate electrodes of the plurality of transistor structures and the first electrode plate Cst1 of the storage capacitor Cst, and the second gate metal layer is used to form the second electrode plate Cst2 of the storage capacitor Cst.

In the above, the first electrode plate Cst1 and the gate electrode of the transistor structure are arranged at the same layer and made of the same material, so that the first electrode plate Cst1 and the gate electrode of the transistor structure can be formed simultaneously in the same patterning process, so as to better simplify the production process of the display panel and save the production cost. Similarly, the third auxiliary signal line layer and the second electrode plate Cst2 are arranged at the same layer and made of the same material, so that the third auxiliary signal line layer and the second electrode plate Cst2 can be formed simultaneously in the same patterning process, thereby better simplifying the production process of the display panel and saving the production cost.

It should be noted that the above "the same layer" refers to a layer structure formed by using the same film forming process to form a film layer of a specific pattern, and then using the same mask to form the layer structure through a single patterning process. Depending on the specific pattern, one patterning process may include a plurality of exposure, development or etching processes, and the specific patterns in the formed layer structure may be continuous or discontinuous, and these specific patterns may also be at different heights or have different thicknesses.

As shown in FIG. 3 and FIG. 9, in some embodiments, the display panel further includes:

a light-emitting control signal line layer, the light-emitting control signal line layer includes a light-emitting control signal line pattern 903 located in each of the sub-pixel areas, and at least part of the light-emitting control signal line pattern 903 extends along the first direction;

a reset signal line layer, the reset signal line layer includes a reset signal line pattern 905 located in each of the sub-pixel areas, and the reset signal line pattern 905 extends along the first direction;

In the same sub-pixel area, an orthographic projection of the third auxiliary signal line pattern 805 on the substrate is located between an orthographic projection of the light-emitting control signal line pattern 903 on the substrate and an orthographic projection of the reset signal line pattern 905 on the substrate, the third auxiliary signal line pattern 805 is formed in a wavy structure.

Specifically, the light-emitting control signal line layer includes light-emitting control signal line patterns 903 corresponding to the sub-pixel areas in a one-to-one manner, the light-emitting control signal line pattern 903 is located in the corresponding sub-pixel area, and at least part of the light-emitting control signal line pattern 903 extends along the first direction, and the light-emitting control signal line patterns 903 located in the same row of the sub-pixel areas are electrically connected in sequence to form an integral structure.

The reset signal line layer includes reset signal line patterns 905 corresponding to the sub-pixel areas in a one-to-one manner, the reset signal line pattern 905 is located in the corresponding sub-pixel area, and the reset signal line pattern 905 extends along the first direction.

In the display panel provided by the above embodiment, in the same sub-pixel area, the orthographic projection of the third auxiliary signal line pattern 805 on the substrate is located between the orthographic projection of the light-emitting control signal line pattern 903 on the substrate and the orthographic projection of the reset signal line pattern 905 on the substrate, and the third auxiliary signal line pattern 805 is formed into a wavy structure; third auxiliary signal line patterns 805 in the same row of sub-pixel areas along the first direction are coupled in sequence, the third auxiliary signal line pattern 805 needs to occupy a large horizontal layout space, and the third auxiliary signal line pattern 805 will not overlaps the light-emitting control signal line pattern 903 too much, thereby avoiding increasing the resistance-capacitance (RC) loading of the light-emitting control signal line patterns 903 and increasing the power consumption of the gate driving circuit in the display panel.

Moreover, when both the third auxiliary signal line pattern 805 and the second electrode plate Cst2 of the storage capacitor Cst are made of the second gate metal layer, the above arrangement does not require reducing the area of the second electrode plate Cst2 of the storage capacitor Cst to meet the layout space requirements of the third auxiliary signal line pattern 805, so that the area of the second electrode plate Cst2 of the storage capacitor Cst is large enough, which is more conducive to the maintenance of the gate signal of the driving transistor in the sub-pixel driving circuit, as well as the size and layout design of the driving transistor.

In addition, the above-mentioned third auxiliary signal line pattern 805 is formed into a wavy structure, more specifically, for example, similar to a W-shaped structure, so that the third auxiliary signal line pattern 805 can make good use of the layout space between the light-emitting control signal line pattern 903 and the reset signal line pattern 905 to solve the problem of dynamic crosstalk and facilitate the development of the display panel toward high resolution.

Figure 8:
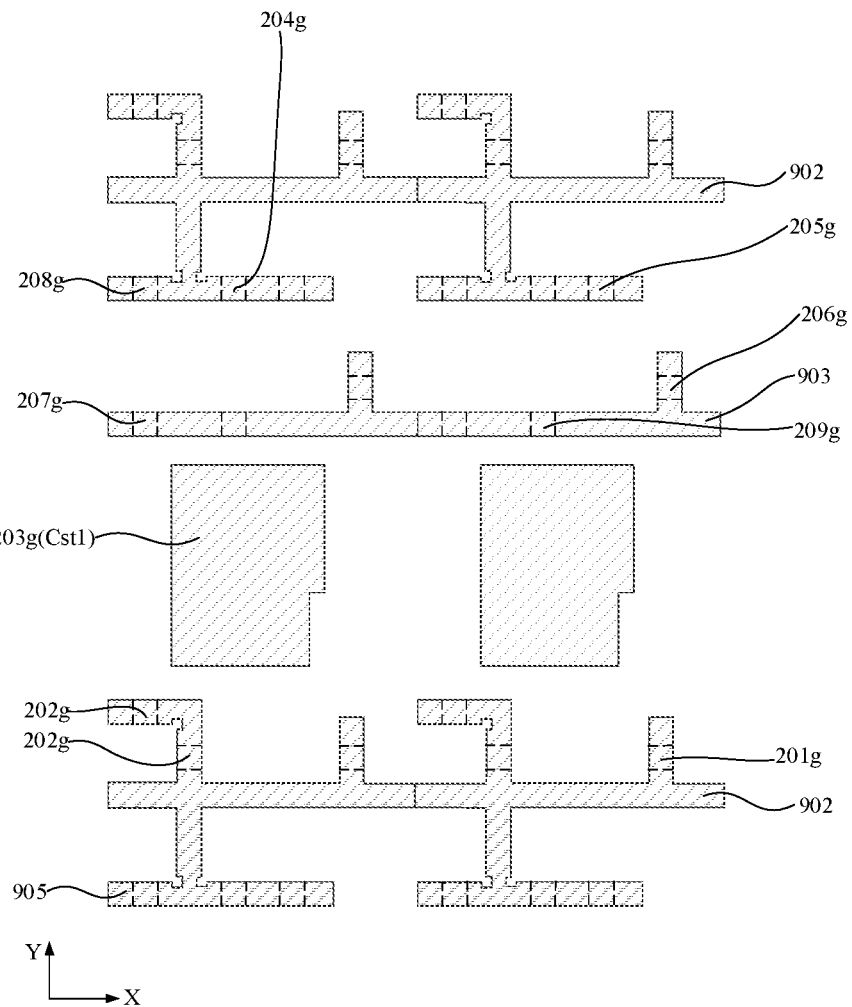
FIG. 8 is a schematic diagram of a layout of a first gate metal layer in FIG. 3.
Figure 10:
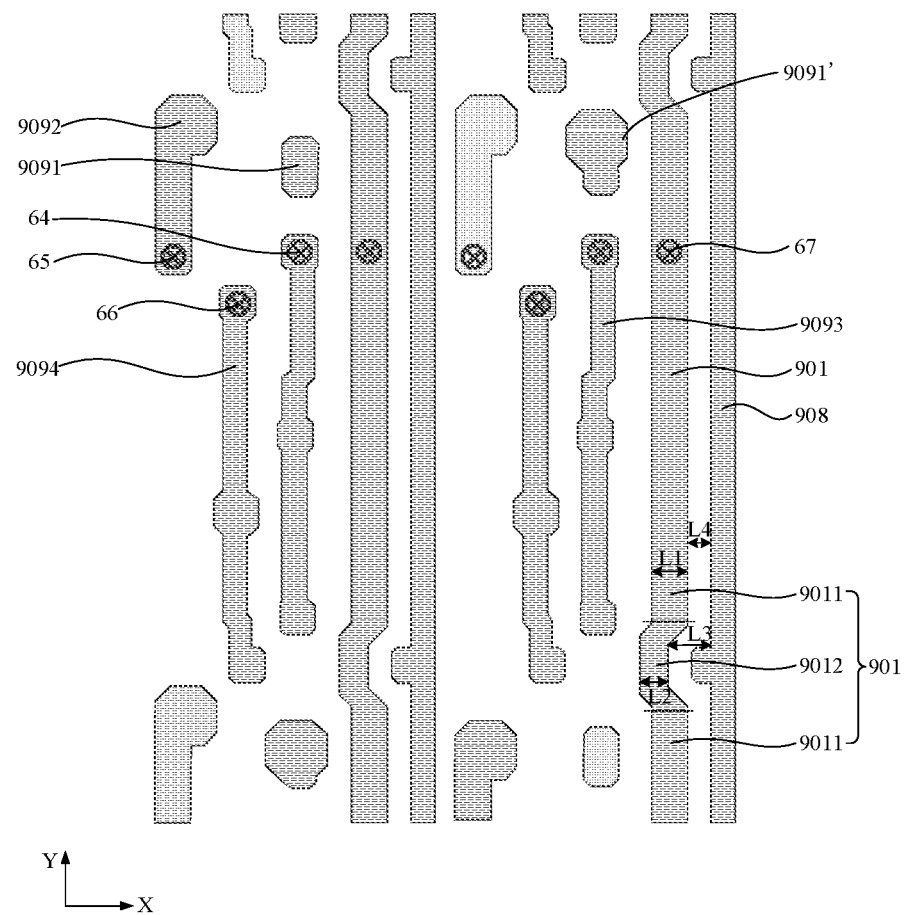
FIG. 10 is a schematic diagram of a layout of a first source-drain metal layer in FIG. 3.

As shown in FIG. 3, FIG. 8 and FIG. 10, in some embodiments, the display panel further includes:

a gate line layer, the gate line layer includes a gate line pattern 902 located in each of the sub-pixel areas, and at least part of the gate line pattern 902 extends along the first direction;

a data line layer, the data line layer includes a data line pattern 908 located in each of the sub-pixel areas, at least part of the data line pattern 908 extends along a second direction, the first direction intersects the second direction, the orthographic projection of the data line pattern 908 on the substrate overlaps the orthographic projection of the gate line pattern 902 on the substrate;

the conductive connection portion layer includes a third conductive connection portion 9093 and a fourth conductive connection portion 9094 located in each of the sub-pixel areas;

Sub-pixel driving circuits corresponding to the sub-pixel areas in a one-to-one manner, each of the sub-pixel driving circuits includes: a driving transistor (i.e., a third transistor T3), a storage capacitor Cst, a first transistor T1 and a second transistor T2; a gate electrode of the driving transistor is multiplexed as the first electrode plate Cst1 of the storage capacitor Cst, and the gate electrode of the driving transistor is coupled to the second electrode D2 of the second transistor T2 through the fourth conductive connection portion 9094 in the corresponding sub-pixel area, and the second electrode plate Cst2 of the storage capacitor Cst is coupled to the second electrode D1 of the first transistor T1 through the third conductive connection portion 9093 in the corresponding sub-pixel area; the gate electrode 201g of the first transistor T1 and the gate electrode 202g of the second transistor T2 are respectively coupled to the gate line pattern 902 in the corresponding sub-pixel area; the orthographic projection of the gate line pattern 902 on the substrate does not overlap the orthographic projection of the third conductive connection portion 9093 on the substrate, and/or the orthographic projection of the gate line pattern 902 on the substrate does not overlap the orthographic projection of the fourth conductive connection portion 9094 on the substrate.

Specifically, the gate line layer includes a plurality of gate line patterns 902, the gate line patterns 902 correspond to the plurality of sub-pixel areas in a one-to-one manner, and the gate line pattern 902 is located in the corresponding sub-pixel area, and is used to provide a scan signal to the sub-pixel driving circuit corresponding to the sub-pixel area. At least part of the gate line pattern 902 extends along the first direction, and the gate line patterns 902 located in the same row of the sub-pixel areas along the first direction are electrically connected in sequence to form an integral structure.

The data line layer includes a plurality of data line patterns 908, the data line patterns 908 correspond to the plurality of sub-pixel areas in a one-to-one manner, and the data line pattern 908 is located in the corresponding sub-pixel area and is used to provide a data signal to the sub-pixel driving circuit corresponding to the sub-pixel are. At least part of the data line pattern 908 extends along the second direction, and the data line patterns 908 located in the same column of sub-pixel areas along the second direction are electrically connected in sequence to form an integral structure.

The conductive connection portion layer can be made of the first source-drain metal layer in the display panel, and the specific structures of the third conductive connection portion 9093 and the fourth conductive connection portion 9094 included in the conductive connection portion layer can be set based on actual needs. For example, at least part of the third conductive connection portion 9093 extends along the second direction, and at least part of the fourth conductive connection portion 9094 extends along the second direction.

The sub-pixel driving circuits correspond to the sub-pixel areas in a one-to-one manner, and each sub-pixel driving circuit includes a driving transistor, a storage capacitor Cst, a first transistor T1 and a second transistor T2; the driving transistor may generate the driving signal for driving the light-emitting element to emit light, the gate electrode of the driving transistor is coupled to the first electrode plate Cst1 of the storage capacitor Cst. Exemplarily, the gate electrode of the driving transistor can be multiplexed as the first electrode plate Cst1 of the storage capacitor Cst.

The gate electrode of the driving transistor can also be coupled to the second electrode D2 of the second transistor T2 through the fourth conductive connection portion 9094 in the corresponding sub-pixel area, and the first electrode S2 of the second transistor T2 is coupled to the second electrode D2 of the second transistor T2. The gate electrode 202g of the second transistor T2 is coupled to the gate line pattern 902 in the corresponding sub-pixel area. The second electrode plate Cst2 of the storage capacitor Cst is coupled to the second electrode D1 of the first transistor T1 through the third conductive connection portion 9093 in the corresponding sub-pixel area, and the first electrode of the first transistor T1 S1 is coupled to the data line pattern 908 in the corresponding sub-pixel area, and the gate electrode 201g of the first transistor T1 is coupled to the gate line pattern 902 in the corresponding sub-pixel area.

Since the gate electrode of the driving transistor can be coupled to the second electrode D2 of the second transistor T2 through the fourth conductive connection portion 9094, and coupled to the second electrode D1 of the first transistor T1 through the storage capacitor Cst and the third conductive connection portion 9093, so the signals on the third conductive connection portion 9093 and the fourth conductive connection portion 9094 can both affect the gate signal of the driving transistor.

In the above setting, the orthographic projection of the data line pattern 908 on the substrate overlaps the orthographic projection of the gate line pattern 902 on the substrate, and the orthographic projection of the gate line pattern 902 on the substrate does not overlap the orthographic projection of the third conductive connection portion 9093 on the substrate, and/or the orthographic projection of the gate line pattern 902 on the substrate does not overlap the orthographic projection of the fourth conductive connection portion 9094 on the substrate; so that in the same sub-pixel area, in a direction perpendicular to the substrate, the gate line pattern 902 can only overlap the data line pattern 908, but does not overlap the third conductive connection portion 9093 and/or the fourth conductive connection portion 9094, thereby preventing a series parasitic electricity from forming between the data line pattern 908 and the third conductive connection portion 9093 and/or the fourth conductive connection portion 9094 through the gate line pattern 902, which effectively improves the crosstalk problem of the gate voltage change of the driving transistor caused by the jump of the data signal transmitted on the data line pattern 908.

Therefore, in the display panel provided by the above embodiment, when the display panel is in the light-emitting state, even if the voltage jump of the data signal transmitted on the data line pattern 908 occurs, the change of the gate voltage of the driving transistor will not occur by the parasitic capacitance. Therefore, the stability of the gate voltage of the driving transistor is well guaranteed, the static crosstalk phenomenon is avoided, and the display quality of the display panel is effectively improved.

In some embodiments, the conductive connection portion layer further includes a second conductive connection portion 9092 located in each of the sub-pixel areas, the second conductive connection portion 9092 overlaps the orthographic projection of the anode pattern 906 corresponding to the sub-pixel area where the second conductive connection portion 9092 is located on the substrate, and the second conductive connection portion 9092 is coupled to the anode pattern 906 at the overlapping area;

Each of the sub-pixel driving circuits further includes a fifth transistor T5, an eighth transistor T8 and a ninth transistor T9;

A gate electrode 205g of the fifth transistor T5 is coupled to the corresponding reset signal line pattern 905, a first electrode S5 of the fifth transistor T5 is coupled to the corresponding initialization signal line pattern 904, a second electrode D5 of the fifth transistor T5 is coupled to the third conductive connection portion 9093 through the fourth via hole 64;

A gate electrode 208g of the eighth transistor T8 is coupled to the corresponding reset signal line pattern 905, a first electrode S8 of the eighth transistor T8 is coupled to the corresponding initialization signal line pattern 904, a second electrode D8 of the eighth transistor T8 is coupled to the second conductive connection portion 9092 through the fifth via hole 65;

A gate electrode 209g of the ninth transistor T9 is coupled to the corresponding light-emitting control signal line pattern 903, and a first electrode S9 of the ninth transistor T9 is coupled to the fourth conductive connection portion 9094 through the sixth via hole 66, a second electrode D9 of the ninth transistor T9 is floating;

The third auxiliary signal line pattern 805 includes a first auxiliary portion, a second auxiliary portion and a third auxiliary portion that are coupled in sequence; in one sub-pixel area, the orthographic projection of the first auxiliary portion on the substrate is located between the orthographic projection of the fifth via hole 65 on the substrate and the orthographic projection of the sixth via hole 66 on the substrate, and the orthographic projection of the second auxiliary portion on the substrate is located between the orthographic projection of the fifth via hole 65 on the substrate and the orthographic projection of the fourth via hole 64 on the substrate; the orthographic projection of the third auxiliary portion on the substrate is located between the orthographic projection of the sixth via hole 66 on the substrate and the orthographic projection of the fourth via hole 64 on the substrate.

Specifically, the conductive connection portion layer includes a plurality of second conductive connection portions 9092, the second conductive connection portions 9092 correspond to the plurality of sub-pixel areas in a one-to-one manner, and the second conductive connection portion 9092 overlaps the orthographic projection of the anode pattern 906 corresponding to the sub-pixel area on the substrate, and the second conductive connection portion 9092 is coupled to the anode pattern 906 at the overlapping area.

The eighth transistor T8 can be turned on or off under the control of the reset signal transmitted on the reset signal line pattern 905 coupled to the eight transistor T8, so that the anode pattern 906 coupled to the eighth transistor T8 through the second conductive connection portion 9092 is reset.

The fifth transistor T5 can be turned on or off under the control of the reset signal transmitted on the reset signal line pattern 905 coupled to the fifth transistor T5, so that the second electrode plate Cst2 of the storage capacitor Cst coupled to the fifth transistor T5 is reset.

Exemplarily, the fifth via hole 65 and the fourth via hole 64 are arranged along the first direction, and the sixth via hole 66 is closer to the light-emitting control signal line pattern 903 than the fourth via hole 64, lines connecting the orthographic projection of the fourth via hole 64 on the substrate, the orthographic projection of the fifth via hole 65 on the substrate, and the orthographic projection of the sixth via hole 66 on the substrate form a triangle-like structure.

It should be noted that the fourth via hole 64, the fifth via hole 65 and the sixth via hole 66 are all via holes penetrating through the interlayer insulating layer (ILD layer).

In the above setting, the third auxiliary signal line pattern 805 includes the first auxiliary portion, the second auxiliary portion and the third auxiliary portion coupled in sequence, so that the third auxiliary signal line pattern 805 can be reasonably used the space among the fourth via hole 64, the fifth via hole 65 and the sixth via hole 66, so that the third auxiliary signal line pattern 805 is formed into a W-shaped structure. The third auxiliary signal line pattern 805 can make good use of the layout space between the light-emitting control signal line pattern 903 and the reset signal line pattern 905, which not only solves the problem of dynamic crosstalk, but also facilitates the development of the display panel towards high-resolution. It is worth noting that the above layout can support a display panel with a pixel resolution of 480PPI.

As shown in FIG. 3 and FIG. 9, in some embodiments, the display panel further includes:

a data line layer, the data line layer includes a data line pattern 908 located in each of the sub-pixel areas, and at least part of the data line pattern 908 extends along the second direction;

The adjacent third auxiliary signal line patterns 805 located in the same row of sub-pixel areas along the first direction form a shielding portion 8051 at the coupling area, the shielding portion 8051 extends along the second direction, and the orthographic projection of the shielding portion 8051 on the substrate overlaps the orthographic projection of the data line pattern 908 on the substrate, and along the direction perpendicular to the second direction, the width of the shielding portion 8051 is larger than the width of the data line pattern 908.

Specifically, the shielding portion 8051 can be formed as a rectangular-like structure extending along the second direction. By setting the orthographic projection of the shielding portion 8051 on the substrate overlapping the orthographic projections of the data line pattern 908 on the substrate, the shielding portion 8051 can shield the data line pattern 908, thereby improving the static crosstalk phenomenon caused by the jump of the data signal transmitted on the data line pattern 908.

In addition, along the direction perpendicular to the second direction, the width of the shielding portion 8051 is greater than the width of the data line pattern 908, so that the overlapping area between the shielding portion 8051 and the data line pattern 908 is larger, which is more beneficial to improve the static crosstalk phenomenon caused by the jump of the data signal transmitted on the data line pattern 908.

It should be noted that, the shielding portion 8051 and the adjacent third auxiliary signal line pattern 805 can be formed into an integral structure, but not limited thereto.

As shown in FIG. 3 and FIG. 10, in some embodiments, the display panel further includes:

sub-pixel driving circuits corresponding to the sub-pixel areas in a one-to-one manner, each of the sub-pixel driving circuits including a driving transistor;

a data line layer, the data line layer includes a data line pattern 908 located in each of the sub-pixel areas, at least part of the data line pattern 908 extends along a second direction, the first direction and the second direction intersect;

a power supply signal line layer, the power supply signal line layer includes a power supply signal line pattern 901 located in each of the sub-pixel areas, and at least part of the power supply signal line pattern 901 extends along the second direction;

In the same sub-pixel area, the orthographic projection of the power signal line pattern 901 on the substrate is located between an orthographic projection of a gate electrode of the driving transistor (i.e., the gate electrode 203g of the third transistor T3) on the substrate and the orthographic projection of the data line pattern 908 on the substrate.

Specifically, at least part of the power signal line pattern 901 extends along the second direction, and at least part of the data line pattern 908 extends along the second direction. The orthographic projection of the power signal line pattern 901 on the substrate is located between the orthographic projection of the gate electrode of the driving transistor on the substrate and the orthographic projection of the data line pattern 908 on the substrate, so that the distance between the data line pattern 908 and the gate electrode of the driving transistor is made farther, and the power signal line pattern 901 forms a good isolation between the data line pattern 908 and the gate electrode of the driving transistor, thereby reducing the lateral parasitic capacitance formed between the data line pattern 908 and the gate electrode of the driving transistor in the same sub-pixel area, effectively improving the stability of the gate potential of the driving transistor.

As shown in FIG. 3 and FIG. 10, in some embodiments, the power signal line pattern 901 includes a first power supply portion 9011 and a second power supply portion 9012 coupled to each other, and the first power supply portion 9011 extends along the second direction 9011, the second power supply portion 9012 protrudes from the first power supply portion 9011 in a direction away from the data line pattern 908 in the sub-pixel area where the second power supply portion 9012 is located; in a direction perpendicular to the second direction and parallel to the substrate, the width L1 of the first power supply portion 9011 is greater than the width L2 of the second power supply portion 9012;

The orthographic projection of the first electrode of the driving transistor (i.e., the first electrode S3 of the third transistor T3) on the substrate overlaps the orthographic projection of the first power supply portion 9011 in the corresponding sub-pixel area on the substrate, and the first electrode of the driving transistor and the first power supply portion 9011 are coupled at the overlapping area.

Specifically, the specific structure of the power supply signal line pattern 901 is various. Exemplarily, the power supply signal line pattern 901 includes a first power supply portion 9011 and a second power supply portion 9012 that are coupled to each other. The first power supply portion 9011 extends along the second direction, and a first spacing area is formed between the first power supply portion 9011 and the data line pattern 908 in the sub-pixel area where the first power supply portion 9011 is located; the second power supply portion 9012 protrudes from the first power supply portion 9011 in a direction away from the data line pattern 908 in the sub-pixel area where the second power supply portion 9011 is located. A second spacing area is formed between the second power supply portion 9012 and the data line pattern 908, along a direction perpendicular to the second direction, the maximum width L3 of the second spacing area is greater than the maximum width L4 of the first spacing area.

By setting the orthographic projection of the first electrode of the driving transistor (i.e., the first electrode S3 of the third transistor T3) on the substrate overlaps the orthographic projection of the first power supply portion 9011 in the corresponding sub-pixel area on the substrate, so that the first electrode of the driving transistor and the first power supply portion 9011 can be coupled through the connection hole 69 in the overlapping area.

In the above arrangement, in a direction perpendicular to the second direction and parallel to the substrate, the width of the first power supply portion 9011 is greater than the width of the second power supply portion 9012, and the orthographic projection of the first electrode of the driving transistor on the substrate overlaps the orthographic projection of the first power supply portion 9011 in the corresponding sub-pixel area on the substrate, and the first electrode of the driving transistor and the first power supply portion 9011 are coupled at the overlapping area, so that a larger overlapping area may be formed between the orthographic projection of the first electrode of the driving transistor on the substrate and the orthographic projection of the first power supply portion 9011 in the corresponding sub-pixel area on the substrate, a connection hole 69 with a larger diameter can be formed at the overlapping area, which is more conductive the coupling performance of the first electrode of the driving transistor and the power signal line pattern 901.

As shown in FIG. 3, FIG. 9 and FIG. 10, in some embodiments, the display panel further includes:

A first shielding layer, the first shielding layer includes a first shielding pattern 804 located in each of the sub-pixel areas, and an orthographic projection of the first shielding pattern 804 on the substrate overlaps the orthographic projection of the first power supply portion 9011 on the substrate, the first shielding pattern 804 is coupled to the first power supply portion 9011 at the overlapping area; at least part of the first shielding pattern 804 extends along the second direction, the orthographic projection of the first shielding pattern 804 on the substrate overlaps the orthographic projection of the data line pattern 908 on the substrate.

Specifically, the first shielding layer includes a plurality of first shielding patterns 804, the first shielding patterns 804 correspond to the sub-pixel areas in a one-to-one manner, and the first shielding pattern 804 is located in the corresponding sub-pixel area. Exemplarily, at least part of the first shielding pattern 804 extends along the second direction, and at least part of the data line pattern 908 extends along the second direction, and in the same sub-pixel area, the orthographic projection of the first shielding pattern 804 on the substrate overlaps the orthographic projection of the data line pattern 908 on the substrate; this arrangement enables that a larger overlapping area is formed between the first shielding pattern 804 and the data line pattern 908, which makes the shielding effect of the first shielding pattern 804 on the data line pattern 908 more significant.

As shown in FIG. 8, exemplarily, the first shielding layer is made of the second gate metal layer in the display panel, that is, the first shielding layer and the second electrode plate Cst2 of the storage capacitor Cst are formed in the same patterning process.

A signal with a fixed potential is transmitted on the first shielding layer. Exemplarily, the first shielding pattern 804 is coupled to the power signal line pattern 901 in the display panel, and has a same stable potential as the power signal transmitted on the power signal line. Exemplarily, the orthographic projection of the first shielding pattern 804 on the substrate overlaps the orthographic projection of the first power supply portion on the substrate, the first shielding pattern 804 is coupled to the first power supply portion at the overlapping area; since the first power supply portion has a larger width in the direction perpendicular to the second direction, a larger overlapping area is formed between the first shielding pattern 804 and the first power supply portion, which is more conducive to forming a connection hole with a larger diameter at the overlapping area, so as to ensure a better coupling performance between the first shielding pattern 804 and the first power supply portion.

In the display panel provided by the above embodiment, by setting the first shielding layer with a stable potential to overlap the data line pattern 908, the parasitic capacitance between the data line pattern 908 and the gate electrode of an adjacent driving transistor is well shielded, thereby effectively improving the crosstalk phenomenon caused by the change of the data signal in the display panel to the gate electrode of the driving transistor.

As shown in FIG. 3 and FIG. 10, in some embodiments, the first electrode S1 of the first transistor T1 extends along the first direction, and the orthographic projection of the first electrode S1 of the first transistor T1 on the substrate overlaps the orthographic projection of the data line pattern 908 in the corresponding sub-pixel area on the substrate, and the first electrode S1 of the first transistor T1 and the data line pattern 908 in the corresponding sub-pixel area are coupled through the first connection hole 68 in the overlapping area; the orthographic projection of the first connection hole 68 on the base and the orthographic projection of the second power supply portion 9092 on the base are arranged along a direction perpendicular to the second direction.

Specifically, the specific structures of the first electrode S1 of the first transistor T1 are various, for example, the first electrode S1 of the first transistor T1 extends along the first direction.

By arranging the orthographic projection of the first connection hole 68 on the substrate and the orthographic projection of the second power supply portion 9012 on the substrate to be arranged in a direction perpendicular to the second direction, the first connection hole 68 can be formed in vicinity of the second spacing area, and since the distance between the second power supply portion 9012 and the data line pattern 908 is farther in the second spacing area, it is more beneficial to increase the diameter of the first connection hole 68, thereby effectively improving the coupling performance between the first electrode S1 of the first transistor T1 and the data line pattern 908.

As shown in FIG. 3 and FIG. 8, in some embodiments, the display panel further includes:

a gate line layer, the gate line layer includes a gate line pattern 902 located in each of the sub-pixel areas, and at least part of the gate line pattern 902 extends along the first direction;

A reset signal line layer, the reset signal line layer includes a reset signal line pattern 905 located in each of the sub-pixel areas, and the gate line pattern 902 in the current sub-pixel area and the reset signal line pattern 905 located in an adjacent next sub-pixel area along the second direction form an integral structure.

Specifically, at least part of each of the gate line patterns 902 extends along the first direction, and the gate line patterns 902 located in the same row of sub-pixel areas along the first direction are electrically connected in sequence to form an integral structure; each of the reset signal line patterns 905 extends along the first direction, the gate line pattern 902 in the current sub-pixel area and the reset signal line pattern 905 in the adjacent next sub-pixel area along the second direction form an integral structure through the connection portion extending along the second direction.

The gate line pattern 902, the reset signal line pattern 905, and the light-emitting control signal line pattern 903 included in the display panel can all be made of the first gate metal layer, so that the gate line pattern 902, the reset signal line pattern 905 and the light-emitting control signal line pattern 903 can be formed in the same patterning process, thereby effectively simplifying the production process and saving the production cost.

The gate line pattern 902 in the current sub-pixel area and the reset signal line pattern 905 in the adjacent next sub-pixel area along the second direction form an integral structure, so that the scan signal transmitted on the gate line patterns 902 in a current row of sub-pixel areas signal can be used as the reset signal transmitted on the reset signal line pattern 905 in the adjacent next row of sub-pixels, so as to avoid introducing a special signal transmission path for providing the reset signal to the reset signal line pattern 905, thereby effectively reducing the layout space occupied by the reset signal line pattern 905, and improving the resolution of the display panel. The above layout can support a display panel with a pixel resolution of 400 PPI.

As shown in FIG. 3, in some embodiments, the display panel further includes: a power signal line pattern, a data line pattern, a reset signal line pattern, a light-emitting control signal line pattern and a gate line pattern located in each of the sub-pixel areas; also includes sub-pixel driving circuits corresponding to the sub-pixel areas in a one-to-one manner, each of the sub-pixel driving circuits includes: a first transistor, a second transistor, a third transistor, a fourth transistor, a fifth transistor, a sixth transistor, a seventh transistor, an eighth transistor, a ninth transistor and a storage capacitor;

A gate electrode of the first transistor is coupled to the gate line pattern, a first electrode of the first transistor is coupled to the data line pattern, and a second electrode of the first transistor is coupled to a second electrode plate of the storage capacitor, and a first electrode plate of the storage capacitor is coupled to a gate electrode of the third transistor;

A gate electrode of the second transistor is coupled to the gate line pattern, a first electrode of the second transistor is coupled to a second electrode of the third transistor, and a second electrode of the second transistor is coupled to the gate electrode of the third transistor;

A first electrode of the third transistor is coupled to the power signal line pattern;

A gate electrode of the fourth transistor is coupled to the reset signal line pattern, a first electrode of the fourth transistor is coupled to the initialization signal line pattern, and a second electrode of the fourth transistor is coupled to the gate electrode of the third transistor;

A gate electrode of the fifth transistor is coupled to the reset signal line pattern, a first electrode of the fifth transistor is coupled to the initialization signal line pattern, and a second electrode of the fifth transistor is coupled to the second electrode plate of the storage capacitor;

A gate electrode of the sixth transistor is coupled to the light-emitting control signal line pattern, a first electrode of the sixth transistor is coupled to the initialization signal line pattern, and a second electrode of the sixth transistor is coupled to the second electrode plate of the storage capacitor;

A gate electrode of the seventh transistor is coupled to the light-emitting control signal line pattern, a first electrode of the seventh transistor is coupled to the second electrode of the third transistor, and a second electrode of the seventh transistor is coupled to the corresponding anode pattern;

A gate electrode of the eighth transistor is coupled to the reset signal line pattern, a first electrode of the eighth transistor is coupled to the initialization signal line pattern, and a second electrode of the eighth transistor is coupled to the corresponding anode pattern;

A gate electrode of the ninth transistor is coupled to the corresponding light-emitting control signal line pattern, a first electrode of the ninth transistor is coupled to the gate electrode of the third transistor, and the second electrode of the ninth transistor is floating.

Figure 1:
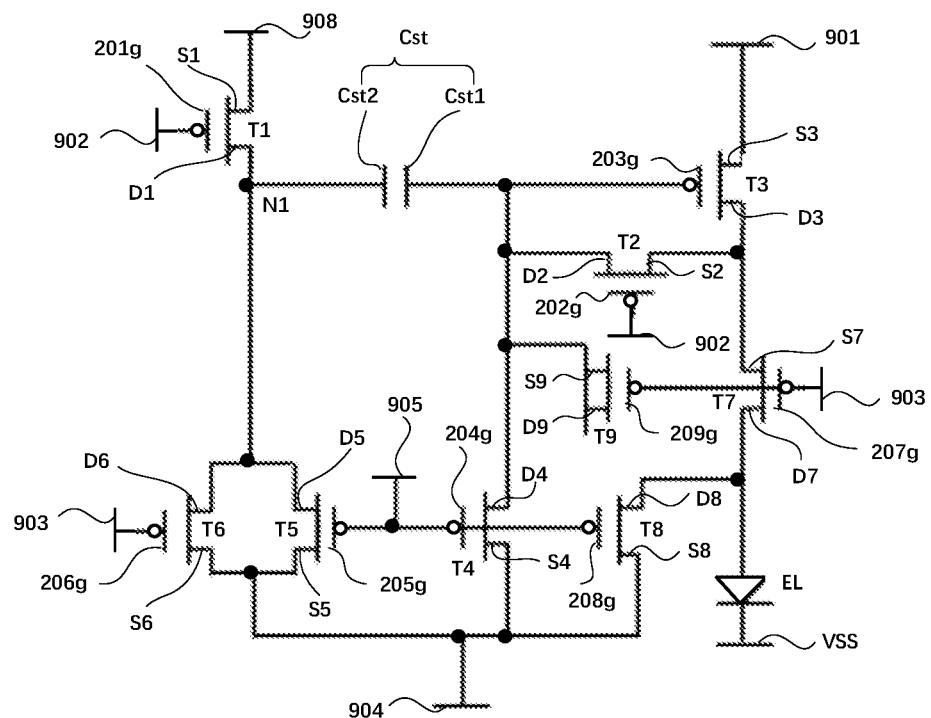
FIG. 1 is a circuit diagram of a sub-pixel driving circuit provided by an embodiment of the present disclosure.

Specifically, as shown in FIGS. 1 and 3, the gate electrode 201g of the first transistor T1 is coupled to the gate line pattern 902, and the first electrode S1 of the first transistor T1 is coupled to the data line pattern 908, the second electrode D1 of the first transistor T1 is coupled to the second electrode plate Cst2 of the storage capacitor Cst, and the first electrode plate Cst1 of the storage capacitor Cst is coupled to the gate electrode 203g of the third transistor T3 (that is, the driving transistor);

The gate electrode 202g of the second transistor T2 is coupled to the gate line pattern 902, the first electrode S2 of the second transistor T2 is coupled to the second electrode D3 of the third transistor T3, the second electrode D2 of the second transistor T2 is coupled to the gate electrode 203g of the third transistor T3;

The first electrode S3 of the third transistor T3 is coupled to the power signal line pattern 901;

The gate electrode 204g of the fourth transistor T4 is coupled to the reset signal line pattern 905, the first electrode S4 of the fourth transistor T4 is coupled to the initialization signal line pattern 904, and the second electrode D4 of the fourth transistor T4 is coupled to the gate electrode 203g of the third transistor T3;

The gate electrode 205g of the fifth transistor T5 is coupled to the reset signal line pattern 905, the first electrode S5 of the fifth transistor T5 is coupled to the initialization signal line pattern 904, and the second electrode D5 of the fifth transistor T5 is coupled to the second electrode plate Cst2 of the storage capacitor Cst;

The gate electrode 206g of the sixth transistor T6 is coupled to the light-emitting control signal line pattern 903, the first electrode S6 of the sixth transistor T6 is coupled to the initialization signal line pattern 904, and the second electrode D6 of the sixth transistor T6 is coupled to the second electrode plate Cst2 of the storage capacitor Cst;

The gate electrode 207g of the seventh transistor T7 is coupled to the light-emitting control signal line pattern 903, the first electrode S7 of the seventh transistor T7 is coupled to the second electrode D3 of the third transistor T3, and the second electrode D7 of the seventh transistor T7 is coupled to the anode pattern 906 of the corresponding light-emitting element EL, and the cathode of the light-emitting element EL is coupled to the negative power signal line VSS;

The gate electrode 208g of the eighth transistor T8 is coupled to the reset signal line pattern 905, the first electrode S8 of the eighth transistor T8 is coupled to the initialization signal line pattern 904, and the second electrode D8 of the eighth transistor T8 is coupled to the anode pattern 906 of the corresponding light emitting element EL.

At least part of the power signal line pattern 901 and the data line pattern 908 extend along the second direction; at least part of the gate line pattern 902, the light-emitting control signal line pattern 903, and the reset signal line pattern 905 are all extending along the first direction, the first direction intersects the second direction. Exemplarily, the first direction includes the X direction, and the second direction includes the Y direction.

The plurality of sub-pixel areas can be divided into a plurality of rows of sub-pixel areas arranged in sequence along the second direction, and a plurality of columns of sub-pixel areas arranged in sequence along the first direction, and the gate line patterns 902 located in the same row of sub-pixel areas are electrically connected in sequence to form an integral structure; the light-emitting control signal line patterns 903 located in the same row of sub-pixel areas are electrically connected in sequence to form an integral structure; the data line patterns located in the same column of sub-pixel areas 908 are electrically connected in sequence to form an integral structure; the power signal line patterns 901 located in the same column of sub-pixel areas are electrically connected in sequence to form an integral structure.

The layout of film layers in the display panel is as follows: a buffer layer, a sub-pixel driving circuit film layer, an anode layer, a pixel defining layer and a spacer layer 70 that are sequentially stacked on the substrate along the direction away from the substrate. The layout of film layers corresponding to the sub-pixel driving circuit is as follows: an active film layer, a first gate insulating layer, a first gate metal layer, a second gate insulating layer, a second gate metal layer, an interlayer insulating layer, a first source-drain metal layer and a planarization layer that are stacked along the direction away from the substrate.

As shown in FIG. 7, the active film layer is used to form the channel areas (e.g.: 101g-109g), the first electrodes (e.g.: S1-S9) and the second electrode (e.g.: D1-D9) of transistors in the sub-pixel driving circuit, due to the doping effect, the conductivity of the active film layer corresponding to the first electrode and the second electrode will be better than that of the active film layer corresponding to the channel area; the active film layer can be made of amorphous silicon, polysilicon, oxide semiconductor materials, etc. It should be noted that, the first electrode and the second electrode may be doped with n-type impurities or p-type impurities. In addition, it should be noted that the active film layer corresponding to the first electrode and the second electrode can be directly used as the source electrode or drain electrode of the corresponding transistor, or the source electrode in contact with the first electrode is made of a metal material, the drain electrode in contact with the second electrode is made of a metal material.

The active film layer is also used to form the initialization signal line pattern 904, and the portion of the active film layer used to form the initialization signal line pattern 904 can have good electrical conductivity due to doping.

The first gate metal layer is used to form the gate electrodes of the transistors in the sub-pixel drive circuit (e.g. 201g-209g), as well as the gate line pattern 902, the light emitting control signal line pattern 903, the reset signal line pattern 905 and other structures included in the display panel, the gate electrode 203g of the third transistor T3 in each sub-pixel driving circuit is multiplexed as the first electrode plate Cst1 of the storage capacitor Cst in the sub-pixel driving circuit.

The second gate metal layer is used to form the second electrode plate Cst2 of the storage capacitor Cst, as well as the first shielding pattern 804 and the third auxiliary signal line layer included in the display panel.

The first source-drain metal layer is used to form the data line pattern 908, the power signal line pattern 901 and some conductive connection portions.

Figure 2:
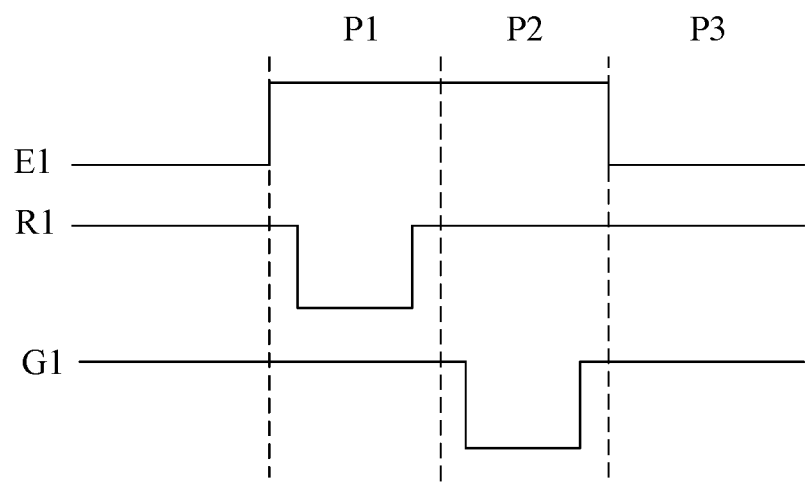
FIG. 2 is a working timing diagram of a sub-pixel driving circuit provided by an embodiment of the present disclosure.

As shown in FIG. 1 and FIG. 2, when the sub-pixel driving circuit with the above structure is in operation, each working cycle includes a reset period P1, a writing-in compensation period P2 and a light-emitting period P3. In FIG. 3, E1 represents the light-emitting control signal transmitted on the light-emitting control signal line pattern 903 in the current sub-pixel area, R1 represents the reset signal transmitted on the reset signal line pattern 905 in the current sub-pixel area, and G1 represents the gate scan signal transmitted on the gate line pattern 902 in the current sub-pixel area.

During the reset period P1, the reset signal inputted by the reset signal line pattern 905 is at a valid level, the fourth transistor T4, the fifth transistor T5 and the eighth transistor T8 are turned on, and the initialization signal transmitted on the initialization signal line pattern 904 is inputted to the gate electrode 203g of the third transistor T3, the anode pattern 906 and the second electrode plate of the storage capacitor, so that the gate-source voltage Vgs maintained on the third transistor T3 in the previous frame is cleared, and the gate electrode 203g of the third transistor T3 is reset, and the anode pattern 906 and the second electrode plate of the storage capacitor are reset at the same time.

During the writing-in compensation period P2, the reset signal inputted by the reset signal line pattern 905 is at an invalid level, the fourth transistor T4, the fifth transistor T5 and the eighth transistor T8 are all turned off, and the scan signal inputted by the gate line pattern 902 is at a valid level, the first transistor T1 and the second transistor T2 is turned on, the data signal is written by the data line pattern 908, and is transmitted to the N1 node through the first transistor T1, and is coupled to the gate electrode of the third transistor T3 through the storage capacitor. At the same time, the first transistor T1 and the second transistor T2 are turned on, so that the third transistor T3 is formed into a diode structure. Therefore, the first transistor T1, the third transistor T3 and the second transistor T2 work together to achieve the threshold voltage compensation of the third transistor T3. When the compensation time is long enough, the potential of the gate electrode 203g of the third transistor T3 can be controlled to finally reach Vth+VDD, where VDD is the power signal voltage value, and Vth represents the threshold voltage of the third transistor T3.

During the light-emitting period P3, the light-emitting control signal written by the light-emitting control signal line pattern 903 is at a valid level, the sixth transistor T6 and the seventh transistor T7 are controlled to be turned on, and the power supply signal transmitted by the power supply signal line pattern 901 is inputted to the source electrode of the third transistor. At the same time, due to the coupling effect of the storage capacitor, the voltage of the gate electrode 203g of the third transistor T3 becomes Vint-Vdata+Vth+VDD, where Vdata represents the data signal voltage value, and Vint represents the initial signal voltage value, so that the third transistor T3 is turned on, the gate-source voltage corresponding to the third transistor T3 is Vdata-Vint+Vth, and the leakage current generated based on the gate-source voltage flows to the anode pattern 906 of the corresponding light-emitting element EL to drive the corresponding light-emitting element EL to emit light.

In some embodiments, the sub-pixel driving circuit further includes a ninth transistor T9, a gate electrode 209g of the ninth transistor T9 is coupled to the light-emitting control signal line pattern 903, the first electrode S9 of the ninth transistor T9 is coupled to the gate electrode 203g of the third transistor T3, and the second electrode D9 of the ninth transistor T9 is floating.

Specifically, during the reset period P1 and the writing-in compensation period P2, the light emitting control signal written by the light emitting control signal line pattern 903 is at an invalid level, and the ninth transistor T9 is controlled to be turned off. In the light-emitting period P3, the light-emitting control signal written by the light-emitting control signal line pattern 903 is at a valid level, and the ninth transistor T9 is controlled to be turned on.

The sub-pixel driving circuit also includes the ninth transistor T9, so that during the light-emitting period, by turning on the ninth transistor T9, the excess charge accumulated on the gate electrode 203g of the third transistor T3 can be released to ensure the stable potential of the gate electrode 203g of the third transistor T3.

It should be noted that when entering the light-emitting period P3 from the writing-in compensation period P2, the potential of the scan signal inputted by the gate line pattern 902 increases, thereby pulling the potential of the gate electrode 203g of the third transistor T3, so that excess charge are accumulated on the gate electrode 203g of the third transistor T3.

Embodiments of the present disclosure further provide a display device, including the display panel provided by the above embodiments.

In the display panel provided by the above-mentioned embodiments, the sub-pixel areas located in the same row along the first direction are divided into a plurality of sub-pixel area groups independent from each other, each sub-pixel area group includes at least two adjacent sub-pixel areas, and at the connection portions 806 corresponding to the sub-pixel area groups in a one-to-one manner are arranged at the same time, and the initialization signal line patterns 904 in sub-pixel areas in the corresponding sub-pixel area group are coupled together through the connection portions 806, and the connection portion 806 in each sub-pixel area group is coupled to the first auxiliary signal line layer 801; this arrangement enables the first auxiliary signal line layer 801 to couple the initialization signal line patterns 904 in each sub-pixel area together, so that the first auxiliary signal line layer 801 can provide an initialization signal for the initialization signal line pattern 904 in each sub-pixel area; therefore, in the display panel provided by the above embodiment, the initialization signal line pattern 904 in each sub-pixel area is coupled to the first auxiliary signal line layer 801 arranged in the anode spacing area 9061, which solves the problem that the initialization signal line patterns 904 in the same row are not easy to be connected together due to the limited layout space of the display panel.

Moreover, in the display panel provided by the above-mentioned embodiment, the first auxiliary signal line layer 801 can be laid out in all the anode spacing areas 9061 in the display area, and the initialization signal line pattern 904 in each sub-pixel area can be coupled to the first auxiliary signal line layer 801, thereby ensuring the stability of the initialization signal transmitted on the initialization signal line pattern 904 in each sub-pixel area. In addition, by arranging the first auxiliary cathode layer in the anode spacing area 9061, the first auxiliary signal line layer 801 and the anode layer can be arranged at the same layer, which is more beneficial to the thinning of the display panel.

In addition, in the display panel provided by the above embodiment, by dividing the sub-pixel area groups and introducing the connection portion 806 to couple initialization patterns in the sub-pixel area group to the first auxiliary signal line pattern, so that only one via structure needs to be provided between each connection portion 806 and the first auxiliary signal line layer 801, so as to realize the coupling between the initialization signal line pattern 904 in the at least two sub-pixel areas coupled to the connection portion 806 and the first auxiliary signal line layer 801. Therefore, in the display panel provided by the embodiment of the present disclosure, the initialization signal line patterns 904 are all coupled to the first auxiliary signal line pattern, the number of via hole structures penetrating the planarization layer PLN is effectively reduced at the same time.

Therefore, when the display device provided by the embodiment of the present disclosure includes the display panel provided by the above-mentioned embodiment, it also has the above-mentioned beneficial effects, which will not be repeated here.

It should be noted that the display device may be any product or component with a display function, such as a TV, a monitor, a digital photo frame, a mobile phone, and a tablet computer.

An embodiment of the present disclosure further provides a method for manufacturing a display panel, the display panel includes a plurality of sub-pixel areas arranged in an array, sub-pixel areas in the same row along the first direction are divided into a plurality of sub-pixel area groups independent from each other, and each sub-pixel area group includes adjacent at least two sub-pixel areas; the method includes:

forming an initialization signal line layer, a connection layer, an anode layer and a first auxiliary signal line layer on a substrate;

The initialization signal line layer includes an initialization signal line pattern arranged in each of the sub-pixel areas;

The connection layer includes a connection pattern arranged in each of the sub-pixel areas. At least part of the connection pattern extends along the first direction, and the connection pattern is coupled to the initialization signal line pattern in the sub-pixel area where the connection pattern is located; the connection patterns located in the same sub-pixel area group are sequentially coupled along the first direction to form the connection portion;

The anode layer includes a plurality of anode patterns corresponding to the plurality of sub-pixel areas in a one-to-one manner, the plurality of anode patterns are arranged at intervals, and an anode spacing area is formed between adjacent anode patterns;

The first auxiliary signal line layer is a grid structure, and at least part of the first auxiliary signal line layer is located in the anode spacing area, and is insulated from the anode pattern, the connection pattern in each of the sub-pixel area groups is coupled to the first auxiliary signal line layer.

According to the display panel manufactured by the method according to the embodiment of the present disclosure, the sub-pixel areas in the same row along the first direction are divided into a plurality of sub-pixel area groups independent from each other, and each sub-pixel area group includes at least two adjacent sub-pixel areas, the connection portions 806 corresponding to the sub-pixel area groups in a one-to-one manner are disposed at the same time. The initialization signal patterns 904 in the sub-pixel areas in the corresponding sub-pixel area group are coupled together through the connection portion 806, and the connection portion 806 in each of the sub-pixel area groups is coupled to the first auxiliary signal line layer 801; this arrangement enables the first auxiliary signal line layer 801 to couple all the initialization signal line patterns 904 in each sub-pixel area together, so that the first auxiliary signal line layer 801 can provide an initialization signal for the initialization signal line pattern 904 in each sub-pixel area; therefore, in the display panel provided by the embodiment of the present disclosure, the initialization signal line pattern 904 in each sub-pixel area is respectively coupled to the first auxiliary signal line layer 801 arranged in the anode spacing area 9061, which solves the problem that the initialization signal line patterns 904 in the same row are not easily connected together due to the limited layout space of the display panel.

Moreover, in the display panel manufactured by the method provided by the embodiment of the present disclosure, the first auxiliary signal line layer 801 may be arranged in all the anode spacing areas 9061 in the display area, and the initialization signal line pattern 904 in each sub-pixel area is coupled to the auxiliary signal line layer 801 to ensure the stability of the initialization signal transmitted on the initialization signal line pattern 904 in each sub-pixel area. In addition, by arranging the first auxiliary cathode layer in the anode spacing area 9061, the first auxiliary signal line layer 801 and the anode layer can be arranged at the same layer, which is more beneficial to the thinning of the display panel.

In addition, in the display panel manufactured by the method provided by the embodiment of the present disclosure, each initialization pattern in the sub-pixel area group is coupled to the first auxiliary signal line pattern by dividing the sub-pixel area group and introducing the connection portion 806, so that only one via hole structure needs to be provided between each connection portion 806 and the first auxiliary signal line layer 801 to realize the coupling between the connection portion 806 and the first auxiliary signal line layer 801, so that the initialization signal line patterns 904 in the at least two sub-pixel areas coupled to the connection portion 806 is coupled to the first auxiliary signal line layer 801. Therefore, in the display panel provided by the embodiment of the present disclosure, each of the initialization signal line patterns 904 is coupled to the first auxiliary signal line pattern, and the number of via hole structures penetrating the planarization layer PLN is effectively reduced at the same time.

It should be noted that the various embodiments in this specification are described in a progressive manner, and the same or similar parts among the various embodiments can be referred to each other, and each embodiment focuses on the differences from other embodiments. In particular, for the method embodiment, since it is basically similar to the product embodiment, the description is relatively simple, and the relevant part can be referred to the description of the product embodiment.

Unless otherwise defined, the technical or scientific terms used in the present disclosure shall have the usual meanings understood by those with ordinary skills in the field to which this disclosure belongs. The "first", "second" and similar words used in the present disclosure do not indicate any order, quantity or importance, but are only used to distinguish different components. The word "include" or "comprise" and other similar words mean that the element or item appearing before the word encompasses the element or item listed after the word and its equivalents, but does not exclude other elements or items. Similar words such as "connected" or "coupled" are not limited to physical or mechanical connections, but may include electrical connections, whether direct or indirect. "Up", "Down", "Left", "Right", etc. are only used to indicate the relative position relationship. When the absolute position of the described object changes, the relative position relationship may also change accordingly.

It can be understood that when an element such as a layer, film, area, or substrate is referred to as being "on" or "under" another element, the element can be "directly" on or "under" the other element, or there may be intermediate elements therebetween.

In the description of the foregoing embodiments, specific features, structures, materials, or characteristics may be combined in any one or more embodiments or examples in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising: a substrate, and an initialization signal line layer, a connection layer and an anode layer that are sequentially stacked on the substrate along a direction away from the substrate; and a plurality of sub-pixel areas arranged in an array, wherein sub-pixel areas in a same row along a first direction are divided into a plurality of sub-pixel area groups independent from each other, and each of the plurality of sub-pixel area groups includes at least two adjacent sub-pixel areas;

the initialization signal line layer includes an initialization signal line pattern arranged in each of the plurality of sub-pixel areas;

the connection layer includes a connection pattern arranged in each of the plurality of sub-pixel areas, at least part of the connection pattern extends along the first direction, and the connection pattern is coupled to the initialization signal line pattern in a sub-pixel area where the connection pattern is located; connection patterns located in a same sub-pixel area group are sequentially coupled along the first direction to form the connection portion;

the anode layer includes a plurality of anode patterns corresponding to the plurality of sub-pixel areas in a one-to-one manner, the plurality of anode patterns are arranged at intervals, and an anode spacing area is formed between adjacent anode patterns;

the display panel further includes: a first auxiliary signal line layer, the first auxiliary signal line layer is a grid structure, and at least part of the first auxiliary signal line layer is located in the anode spacing area, and is insulated from the anode pattern, the connection pattern in each of the plurality of sub-pixel area groups is coupled to the first auxiliary signal line layer.

2. The display panel according to claim 1, further comprising:

a conductive connection layer, wherein the conductive connection layer includes a first conductive connection portion located in each of the plurality of sub-pixel areas, and in a same sub-pixel area, a first overlapping area is formed between an orthographic projection of the first conductive connection portion on the substrate and an orthographic projection of the initialization signal line pattern on the substrate, and the first conductive connection portion is coupled to the initialization signal line pattern through a first via hole arranged in the first overlapping area, a third overlapping area is formed between the orthographic projection of the first conductive connection portion on the substrate and an orthographic projection of the connection pattern on the substrate, the first conductive connection portion is coupled to the connection pattern through a third via hole arranged in the third overlapping area;

there is a target conductive connection portion in the first conductive connection portion coupled to each connection portion, and a second overlapping area is formed between an orthographic projection of the target conductive connection portion on the substrate and a orthographic projection of the first auxiliary signal line layer on the substrate, and the target conductive connection portion is coupled to the first auxiliary signal line layer through s second via hole arranged in the second overlapping area.

3. The display panel according to claim 2, wherein each initialization signal line pattern includes a first sub-pattern and a second sub-pattern, and in adjacent sub-pixel areas in the same row along the first direction, a second sub-pattern in a previous sub-pixel area and a first sub-pattern in a current sub-pixel area form an integral structure;

in each of the plurality of sub-pixel areas, the first overlapping area is formed between an orthographic projection of the second sub-pattern on the substrate and an orthographic projection of the first conductive connection portion on the substrate, and the first conductive connection portion is coupled to the second sub-pattern through the first via hole arranged in the first overlapping area.

4. The display panel according to claim 1, further comprising:

a power supply signal line layer, wherein the power supply signal line layer includes a power supply signal line pattern arranged in each of the plurality of sub-pixel areas, and at least part of the power supply signal line pattern extends along a second direction, the second direction intersects the first direction;

a third auxiliary signal line layer located between the initialization signal line layer and the power supply signal line layer, wherein the third auxiliary signal line layer includes a third auxiliary signal line pattern located in each of the plurality of sub-pixel areas, at least part of the third auxiliary signal line pattern extends along the first direction; in a same sub-pixel area, a fourth overlapping area is formed between an orthographic projection of the third auxiliary signal line pattern on the substrate and an orthographic projection of the power signal line pattern on the substrate, and the third auxiliary signal line pattern is coupled to the power signal line pattern in the fourth overlapping area; third auxiliary signal line patterns in a same row of sub-pixel areas along the first direction are sequentially coupled.

5. The display panel according to claim 4, further comprising:

a light-emitting control signal line layer, wherein the light-emitting control signal line layer includes a light-emitting control signal line pattern located in each of the plurality of sub-pixel areas, and at least part of the light-emitting control signal line pattern extends along the first direction;

a reset signal line layer, wherein the reset signal line layer includes a reset signal line pattern located in each of the plurality of sub-pixel areas, and the reset signal line pattern extends along the first direction;

wherein in a same sub-pixel area, the orthographic projection of the third auxiliary signal line pattern on the substrate is located between an orthographic projection of the light-emitting control signal line pattern on the substrate and an orthographic projection of the reset signal line pattern on the substrate, the third auxiliary signal line pattern is formed in a wavy structure.

6. The display panel according to claim 5, further comprising:

a gate line layer, wherein the gate line layer includes a gate line pattern located in each of the plurality of sub-pixel areas, and at least part of the gate line pattern extends along the first direction;

a data line layer, wherein the data line layer includes a data line pattern located in each of the plurality of sub-pixel areas, at least part of the data line pattern extends along the second direction, the first direction intersects the second direction, an orthographic projection of the data line pattern on the substrate overlaps an orthographic projection of the gate line pattern on the substrate;

a conductive connection portion layer, wherein the conductive connection portion layer includes a third conductive connection portion and a fourth conductive connection portion located in each of the plurality of sub-pixel areas;

sub-pixel driving circuits corresponding to the plurality of sub-pixel areas in a one-to-one manner, wherein each of the sub-pixel driving circuits includes: a driving transistor, a storage capacitor, a first transistor and a second transistor; a gate electrode of the driving transistor is multiplexed as a first electrode plate of the storage capacitor, and the gate electrode of the driving transistor is coupled to a second electrode of the second transistor through the fourth conductive connection portion in the corresponding sub-pixel area, and a second electrode plate of the storage capacitor is coupled to a second electrode of the first transistor through the third conductive connection portion in the corresponding sub-pixel area; a gate electrode of the first transistor and a gate electrode of the second transistor are respectively coupled to the gate line pattern in the corresponding sub-pixel area; an orthographic projection of the gate line pattern on the substrate does not overlap an orthographic projection of the third conductive connection portion on the substrate, and/or the orthographic projection of the gate line pattern on the substrate does not overlap an orthographic projection of the fourth conductive connection portion on the substrate.

7. The display panel according to claim 6, wherein the conductive connection portion layer further includes a second conductive connection portion located in each of the plurality of sub-pixel areas, the second conductive connection portion overlaps an orthographic projection of the anode pattern corresponding to a sub-pixel area where the second conductive connection portion is located on the substrate, and the second conductive connection portion is coupled to the anode pattern at the overlapping area;

each of the sub-pixel driving circuits further includes a fifth transistor, an eighth transistor and a ninth transistor;

a gate electrode of the fifth transistor is coupled to a corresponding reset signal line pattern, a first electrode of the fifth transistor is coupled to a corresponding initialization signal line pattern, a second electrode of the fifth transistor is coupled to the third conductive connection portion through a fourth via hole;

a gate electrode of the eighth transistor is coupled to the corresponding reset signal line pattern, a first electrode of the eighth transistor is coupled to the corresponding initialization signal line pattern, a second electrode of the eighth transistor is coupled to the second conductive connection portion through a fifth via hole;

a gate electrode of the ninth transistor is coupled to a corresponding light-emitting control signal line pattern, and a first electrode of the ninth transistor is coupled to the fourth conductive connection portion through a sixth via hole, a second electrode of the ninth transistor is floating;

the third auxiliary signal line pattern includes a first auxiliary portion, a second auxiliary portion and a third auxiliary portion that are coupled in sequence; in one sub-pixel area, an orthographic projection of the first auxiliary portion on the substrate is located between an orthographic projection of the fifth via hole on the substrate and an orthographic projection of the sixth via hole on the substrate, and an orthographic projection of the second auxiliary portion on the substrate is located between the orthographic projection of the fifth via hole on the substrate and an orthographic projection of the fourth via hole on the substrate; an orthographic projection of the third auxiliary portion on the substrate is located between the orthographic projection of the sixth via hole on the substrate and the orthographic projection of the fourth via hole on the substrate.

8. The display panel according to claim 5, further comprising:

a data line layer, wherein the data line layer includes a data line pattern located in each of the plurality of sub-pixel areas, and at least part of the data line pattern extends along the second direction;

wherein adjacent third auxiliary signal line patterns located in a same row of sub-pixel areas along the first direction form a shielding portion at the coupling area, the shielding portion extends along the second direction, and an orthographic projection of the shielding portion on the substrate overlaps an orthographic projection of the data line pattern on the substrate, and along a direction perpendicular to the second direction, a width of the shielding portion is larger than a width of the data line pattern.

9. The display panel according to claim 1, further comprising:

sub-pixel driving circuits corresponding to the plurality of sub-pixel areas in a one-to-one manner, each of sub-pixel driving circuits including a driving transistor;

a data line layer, wherein the data line layer includes a data line pattern located in each of the plurality of sub-pixel areas, at least part of the data line pattern extends along a second direction, the first direction intersects the second direction intersect;

a power supply signal line layer, wherein the power supply signal line layer includes a power supply signal line pattern located in each of the plurality of sub-pixel areas, and at least part of the power supply signal line pattern extends along the second direction;

wherein in a same sub-pixel area, an orthographic projection of the power signal line pattern on the substrate is located between an orthographic projection of a gate electrode of the driving transistor on the substrate and an orthographic projection of the data line pattern on the substrate.

10. The display panel according to claim 9, wherein the power signal line pattern includes a first power supply portion and a second power supply portion coupled to each other, and the first power supply portion extends along the second direction, the second power supply portion protrudes from the first power supply portion in a direction away from a data line pattern in the sub-pixel area where the second power supply portion is located; in a direction perpendicular to the second direction and parallel to the substrate, a width of the first power supply portion is greater than a width of the second power supply portion;

an orthographic projection of a first electrode of the driving transistor on the substrate overlaps an orthographic projection of the first power supply portion in the corresponding sub-pixel area on the substrate, and the first electrode of the driving transistor and the first power supply portion are coupled at the overlapping area.

11. The display panel according to claim 10, further comprising:
a first shielding layer, wherein the first shielding layer includes a first shielding pattern located in each of the plurality of sub-pixel areas, and an orthographic projection of the first shielding pattern on the substrate overlaps the orthographic projection of the first power supply portion on the substrate, the first shielding pattern is coupled to the first power supply portion at the overlapping area; at least part of the first shielding pattern extends along the second direction, the orthographic projection of the first shielding pattern on the substrate overlaps the orthographic projection of the data line pattern on the substrate.

12. The display panel according to claim 1, further comprising:
a gate line layer, wherein the gate line layer includes a gate line pattern located in each of the sub-pixel areas, and at least part of the gate line pattern extends along the first direction;
a reset signal line layer, wherein the reset signal line layer includes a reset signal line pattern located in each of the sub-pixel areas, and the gate line pattern in the current sub-pixel area and the reset signal line pattern located in an adjacent next sub-pixel area along the second direction form an integral structure.

13. The display panel according to claim 1, further comprising:
a power signal line pattern, a data line pattern, a reset signal line pattern, a light-emitting control signal line pattern and a gate line pattern located in each of the plurality of sub-pixel areas; and sub-pixel driving circuits corresponding to the plurality of sub-pixel areas in a one-to-one manner,
wherein each of the sub-pixel driving circuits includes: a first transistor, a second transistor, a third transistor, a fourth transistor, a fifth transistor, a sixth transistor, a seventh transistor, an eighth transistor, a ninth transistor and a storage capacitor;
a gate electrode of the first transistor is coupled to the gate line pattern, a first electrode of the first transistor is coupled to the data line pattern, and a second electrode of the first transistor is coupled to a second electrode plate of the storage capacitor, and a first electrode plate of the storage capacitor is coupled to a gate electrode of the third transistor;
a gate electrode of the second transistor is coupled to the gate line pattern, a first electrode of the second transistor is coupled to a second electrode of the third transistor, and a second electrode of the second transistor is coupled to the gate electrode of the third transistor;
a first electrode of the third transistor is coupled to the power signal line pattern;
a gate electrode of the fourth transistor is coupled to the reset signal line pattern, a first electrode of the fourth transistor is coupled to the initialization signal line pattern, and a second electrode of the fourth transistor is coupled to the gate electrode of the third transistor;
a gate electrode of the fifth transistor is coupled to the reset signal line pattern, a first electrode of the fifth transistor is coupled to the initialization signal line pattern, and a second electrode of the fifth transistor is coupled to the second electrode plate of the storage capacitor;
a gate electrode of the sixth transistor is coupled to the light-emitting control signal line pattern, a first electrode of the sixth transistor is coupled to the initialization signal line pattern, and a second electrode of the sixth transistor is coupled to the second electrode plate of the storage capacitor;
a gate electrode of the seventh transistor is coupled to the light-emitting control signal line pattern, a first electrode of the seventh transistor is coupled to the second electrode of the third transistor, and a second electrode of the seventh transistor is coupled to the corresponding anode pattern;
a gate electrode of the eighth transistor is coupled to the reset signal line pattern, a first electrode of the eighth transistor is coupled to the initialization signal line pattern, and a second electrode of the eighth transistor is coupled to the corresponding anode pattern;
a gate electrode of the ninth transistor is coupled to a corresponding light-emitting control signal line pattern, a first electrode of the ninth transistor is coupled to the gate electrode of the third transistor, and the second electrode of the ninth transistor is floating.

14. A display device comprising the display panel according to claim 1.

15. A method of manufacturing a display panel, wherein the display panel includes a plurality of sub-pixel areas arranged in an array, sub-pixel areas in a same row along a first direction are divided into a plurality of sub-pixel area groups independent from each other, and each of the plurality of sub-pixel area group includes at least two adjacent sub-pixel areas; the method includes:
forming an initialization signal line layer, a connection layer, an anode layer and a first auxiliary signal line layer on a substrate;
the initialization signal line layer includes an initialization signal line pattern arranged in each of the plurality of sub-pixel areas;
the connection layer includes a connection pattern arranged in each of the plurality of sub-pixel areas, at least part of the connection pattern extends along the first direction, and the connection pattern is coupled to the initialization signal line pattern in a sub-pixel area where the connection pattern is located; connection patterns located in a same sub-pixel area group are sequentially coupled along the first direction to form the connection portion;
the anode layer includes a plurality of anode patterns corresponding to the plurality of sub-pixel areas in a one-to-one manner, the plurality of anode patterns are arranged at intervals, and an anode spacing area is formed between adjacent anode patterns;
the first auxiliary signal line layer is a grid structure, and at least part of the first auxiliary signal line layer is located in the anode spacing area, and is insulated from the anode pattern, the connection pattern in each of the plurality of sub-pixel area groups is coupled to the first auxiliary signal line layer.

* * * * *